(12) United States Patent
Anderson et al.

(10) Patent No.: US 7,655,376 B2
(45) Date of Patent: Feb. 2, 2010

(54) PROCESS FOR PRODUCING PHOTONIC CRYSTALS AND CONTROLLED DEFECTS THEREIN

(75) Inventors: Mark T. Anderson, Woodbury, MN (US); Catherine A. Leatherdale, Woodbury, MN (US); D. Scott Thompson, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/596,186

(22) PCT Filed: Dec. 5, 2003

(86) PCT No.: PCT/US03/38775

§ 371 (c)(1), (2), (4) Date: Feb. 21, 2007

(87) PCT Pub. No.: WO2005/066672

PCT Pub. Date: Jul. 21, 2005

(65) Prior Publication Data

US 2007/0282030 A1    Dec. 6, 2007

(51) Int. Cl.
*G03C 9/08* (2006.01)
(52) U.S. Cl. .................. 430/269; 522/83; 522/63; 522/2
(58) Field of Classification Search .......... 522/2, 522/4, 15, 25, 63, 83; 430/269, 280.1, 311
See application file for complete search history.

(56) References Cited

U.S. PATENT DOCUMENTS 2,801,185 A    7/1957    Iler (Continued)

FOREIGN PATENT DOCUMENTS

EP    1 028 328    8/2000

(Continued)

OTHER PUBLICATIONS

Allen R. et al., "High Performance Acrylic Polymers for Chemically Amplified Photoresist Applications", *J. Vac. Sci. Technol.*, 1991, vol. 9, pp. 3357-3361.

(Continued)

*Primary Examiner*—Susan W Berman
(74) *Attorney, Agent, or Firm*—Lucy C. Weiss

(57) ABSTRACT

A process comprises (a) providing a substantially inorganic photoreactive composition comprising (1) at least one cationically reactive species, (2) a multi-photon photoinitiator system, and 10 (3) a plurality of precondensed, inorganic nanoparticles; (b) exposing, using a multibeam interference technique involving at least three beams, at least a portion of the photoreactive composition to radiation of appropriate wavelength, spatial distribution, and intensity to produce a two-dimensional or three-dimensional periodic pattern of reacted and non-reacted portions of the photoreactive composition; (c) exposing at least a portion of the non-reacted portion of the photoreactive composition to radiation of appropriate wavelength and intensity to cause multi-photon absorption and photoreaction to form additional reacted portion; (d) removing the non-reacted portion or the reacted portion of the photoreactive composition to form interstitial void space; and (e) at least partially filling the interstitial void space with at least one material having a refractive index that is different from the refractive index of the remaining portion.

35 Claims, 3 Drawing Sheets

U.S. PATENT DOCUMENTS

| | | | |
|---|---|---|---|
| 3,018,262 A | 1/1962 | Schroeder | |
| 3,117,099 A | 1/1964 | Proops et al. | |
| 3,729,313 A | 4/1973 | Smith | |
| 3,741,769 A | 6/1973 | Smith | |
| 3,779,778 A | 12/1973 | Smith et al. | |
| 3,808,006 A | 4/1974 | Smith | |
| 4,250,053 A | 2/1981 | Smith | |
| 4,279,717 A | 7/1981 | Eckberg et al. | |
| 4,394,403 A | 7/1983 | Smith | |
| 4,406,992 A | 9/1983 | Kurtz et al. | |
| 4,491,628 A | 1/1985 | Ito et al. | |
| 4,522,958 A | 6/1985 | Das et al. | |
| 4,642,126 A | 2/1987 | Zador et al. | |
| 4,652,274 A | 3/1987 | Boettcher et al. | |
| 4,735,632 A | 4/1988 | Oxman et al. | |
| 4,751,138 A | 6/1988 | Tumey et al. | |
| 4,859,572 A | 8/1989 | Farid et al. | |
| 4,963,471 A | 10/1990 | Trout et al. | |
| 5,142,385 A | 8/1992 | Anderson et al. | |
| 5,238,744 A | 8/1993 | Williams et al. | |
| 5,335,240 A | 8/1994 | Ho et al. | |
| 5,406,573 A | 4/1995 | Ozbau et al. | |
| 5,440,421 A | 8/1995 | Fan et al. | |
| 5,526,449 A | 6/1996 | Meade et al. | |
| 5,545,676 A | 8/1996 | Palazzotto et al. | |
| 5,600,483 A | 2/1997 | Fan et al. | |
| 5,648,407 A | 7/1997 | Goetz et al. | |
| 5,739,796 A | 4/1998 | Jasper, Jr. et al. | |
| 5,753,346 A | 5/1998 | Leir et al. | |
| 5,770,737 A | 6/1998 | Reinhardt et al. | |
| 5,856,373 A | 1/1999 | Kaisaki et al. | |
| 5,859,251 A | 1/1999 | Reinhardt et al. | |
| 5,998,495 A | 12/1999 | Oxman et al. | |
| 6,025,406 A | 2/2000 | Oxman et al. | |
| 6,054,007 A | 4/2000 | Boyd et al. | |
| 6,100,405 A | 8/2000 | Reinhardt et al. | |
| 6,358,653 B1 | 3/2002 | Turberfield et al. | |
| 6,569,602 B1 | 5/2003 | Wang | |
| 6,589,334 B2 | 7/2003 | John et al. | |
| 6,593,392 B2 * | 7/2003 | Wang | 522/83 |
| 6,656,990 B2 * | 12/2003 | Shustack et al. | 524/430 |
| 6,723,487 B2 | 4/2004 | Minami et al. | |
| 6,855,478 B2 * | 2/2005 | DeVoe et al. | 430/270.1 |
| 6,858,079 B2 | 2/2005 | Norris et al. | |
| 7,005,229 B2 * | 2/2006 | Nirmal et al. | 430/270.1 |
| 7,008,757 B2 * | 3/2006 | Reichmanis et al. | 430/322 |
| 7,014,988 B2 * | 3/2006 | DeVoe et al. | 430/321 |
| 7,060,419 B2 * | 6/2006 | Bentsen et al. | 430/320 |
| 7,106,519 B2 * | 9/2006 | Aizenberg et al. | 359/620 |
| 7,118,842 B2 * | 10/2006 | Qian et al. | 430/115 |
| 7,168,266 B2 * | 1/2007 | Chen et al. | 65/17.2 |
| 7,265,161 B2 * | 9/2007 | Leatherdale et al. | 522/25 |
| 7,381,516 B2 * | 6/2008 | Arney et al. | 430/270.1 |
| 7,542,186 B2 * | 6/2009 | Misawa et al. | 359/3 |
| 2003/0151032 A1 | 8/2003 | Ito et al. | |
| 2004/0012872 A1 * | 1/2004 | Fleming et al. | 359/885 |
| 2004/0198582 A1 | 10/2004 | Borrelli et al. | |
| 2005/0124712 A1 | 6/2005 | Anderson et al. | |

FOREIGN PATENT DOCUMENTS

| | | |
|---|---|---|
| EP | 1 052 312 A1 | 11/2000 |
| EP | 1 089 095 | 4/2001 |
| JP | 1999-345758 | 12/1999 |
| JP | 2000-009955 | 1/2000 |
| JP | 2000-275859 | 10/2000 |
| JP | 2003-57422 | 2/2003 |
| JP | 2003-084158 | 3/2003 |
| WO | WO 98/21521 | 5/1998 |
| WO | WO 99/53242 | 10/1999 |
| WO | WO 01/18283 | 3/2001 |
| WO | WO 01/22133 A1 | 3/2001 |
| WO | WO 01/55484 A2 | 8/2001 |
| WO | WO 01/66833 A1 | 9/2001 |
| WO | WO 01/96409 A2 | 12/2001 |
| WO | WO 01/96958 A2 | 12/2001 |

OTHER PUBLICATIONS

Allen, R. et al., "193 nm Single Layer Positive Resists Building Etch Resistance Into a High Resolution Imaging System", *SPIE*, vol. 2438, pp. 474-485.

Berlman, I., "Handbook of Fluorescence Spectra of Aromatic Molecules", *Academic Press*, New York, NY, 1971, pp. 24-27.

Beringer F. et al., "Diaryliodonium Salts. IX. The Synthesis of Substituted Diphenyliodonium Salts", *J. Am. Chem. Soc.*, vol. 81, pp. 342-351.

Brinker, C., et al., "Sol-Gel Science The Physics and Chemistry of Sol-Gel Processing", *Academic Press*, 1990, pp. 501-505.

Busch et al., "Photonic Band Gap Formation in Certain Self-Organizing Systems", *Physical Review*, 1998, vol. 58, No. 3, pp. 3896-3908.

Cai et al., "All Fourteen Bravais Lattices can be Formed by Interference of Four Noncoplanar Beams", *Optics Letters*, 2002, vol. 27, No. 11, pp. 900-902.

Campbell, M. et al., "Fabrication of Photonic Crystals for the Visible Spectrum by Holographic Lithography", *Letters to Nature*, 2000, vol. 404, pp. 53-56.

Chutinan, A. et al., "Highly Confined Waveguides and Waveguide Bends in Three-Dimensional Photonic Crystal", *Applied Physics Letters*, 1999, vol. 75, No. 24, pp. 3739-3741.

Demas, J.N. et al., "The Measurement of Photoluminescence Quantum Yields. A Review", *Journal of Physical Chemistry*, 1971, vol. 75, No. 8, pp. 991-1023.

Divliansky, I. et al., "Fabrication of Three-Dimensional Polymer Photonic Crystal Structures Using Single Diffraction Element Interference Lithography", *Applied Physics Letters*, 2003, vol. 82, No. 11, pp. 1667-1669.

Eaton, D., "Dye Sensitized Photopolymerization", *Advances in Photochemistry*, 1986, vol. 13, pp. 427-488.

Ho. K.M. et al., "Existence of a Photonic Gap in Periodic Dielectric Structures", *Physical Review Letters*, 1990, vol. 65, No. 25, pp. 3152-3155.

Jiang et al., "Single-Step Fabrication of Diffraction Gratings on Hybrid Sol-Gel Glass Using Holographic Interference Lithography", *Optics Communications*, 2000, vol. 185, pp. 19-24.

Johnson, S. et al., "Three Dimensionally Periodic Dielectric Layered Structure with Omnidirectional Photonic Band Gap", *Applied Physics Letters*, 2000, vol. 77, No. 22, pp. 3490-3492.

Kirihara, S. et al., "Fabrication of Ceramic-Polymer Photonic Crystals by Stereolithography and Their Microwave Properties", *J. Am. Ceram. Soc.*, 2002, vol. 85, No. 6, pp. 1369-1371.

Kondo, T. et al., "Femtosecond Laser Interference Technique with Diffractive Beam Splitter for Fabrication of Three-Dimensional Photonic Crystals", *Applied Physics Letters*, 2001, vol. 79, No. 6, pp. 725-727.

Kondo et al., "Multiphoton Fabrication of Periodic Structures by Multibeam Interference of Femtosecond Pulses", *Applied Physics Letters*, 2003, vol. 82, No. 17, pp. 2758-2760.

Large, R. F., "The Use of Electrochemical Potential Data in Studies of Spectral Sensitization", *Photographic Sensitivity*, Edited by R. J. Cox, Academic Press, pp. 241-263 (1973).

Lee et al., "Multi-Photon Polymerization of Waveguide Structures Within Three-Dimensional Photonic Crystals", *Advanced Materials*, 2002, vol. 14, No. 4, pp. 271-274.

Miklyaev, Y. et al., "Three-Dimensional Face-Centered-Cubic Photonic Crystal Templates by Laser Holography: Fabrication, Optical Characterization, and Band-Structure Calculations", *Applied Physics Letters*, 2003, vol. 82, No. 8, pp. 1284-1286.

Morris, J. et al., "Fluorescence Quantum Yield Determinations. 9,10-Diphenylanthracene as a Reference Standard in Different Solvents", *Journal of Physical Chemistry*, 1976, vol. 80, No. 9, pp. 969-974.

Noda, Susumu, "Two-and-Three-Dimensional Photonic Cystals in III-V Semiconductors", *MRS Bulletin*, 2001, vol. 26, No. 8, pp. 618-641.

Norris, D. et al., "Chemical Approaches to Three-Dimensional Semiconductor Photonic Crystals", *Advanced Materials*, 2001, vol. 13, pp. 371-376.

Oliveira et al., "Fabrication of GRIN-Materials by Photopolymerization of Diffusion-Controlled Organic-Inorganic Nanocomposite Materials", *MRS Symposium Proceedings*, vol. 435, 1996, pp. 553-558.

Pang et al., "Fabrication of Two-Dimensional Photonic Crystals with Controlled Defects by use of Multiple Exposures and Direct Write", *Applied Optics*, 2003, vol. 42, No. 27, pp. 5450-5456.

Polman et al., "Materials Science Aspects of Photonic Crystals", *MRS Bulletin*, 2001, vol. 26, No. 8, pp. 608-610.

Samoilovich, M. et al., "Artificial Opal Structures for 3D-Optoelectronics", *Microelectronic Engineering*, 2003, vol. 69, pp. 237-247.

Saravanamuttu, K. et al., "Sol-Gel Organic-Inorganic Composites for 3-D Holographic Lithography of Photonic Crystals with Submicron Periodicity", *Chemistry of Materials*, 2003, vol. 15, pp. 2301-2304.

Segawa et al., "Fabrication of Photonic Crystal Structures by Femtosecond Laser-Induced Photopolymerization of Organic-Inorganic Film", *Journal of Sol-Gel Science and Technology*, 2003, vol. 26, pp. 1023-1027.

Serbin et al., "Femtosecond Laser-Induced Two-Photon Polymerization of Inorganic-Organic Hybrid Materials for Applications in Photonics", *Optics Letters*, 2003, vol. 28, No. 5, pp. 301-303.

Sharp et al., "Photonic Crystals for the Visible Spectrum by Holographic Lithography", *Optical and Quantum Electronics*, 2002, vol. 34, pp. 3-12.

Shoji et al., "Photfabrication of Three-Dimensional Photonic Crystals by Multibeam Laser Interference into a Photopolymerizable Resin", *Applied Physics Letters*, 2000, vol. 76, No. 19, pp. 2668-2670.

Straub et al., "Near-Infrared Photonic Crystals with Higher-Order Bandgaps Generated by Two-Photon Photopolymerization", *Optics Letters*, 2002, vol. 27, No. 20, pp. 1824-1826.

Sun, H. et al., "Three-Dimensional Photonic Crystal Structures Achieved with Two-Photon-Absorption Photopolymerization of Resin", *Applied Physics Letters*, vol. 74. No. 6, pp. 786-788.

Taton et al., "Defective Promise in Photonics", *Nature*, 2002, vol. 416, pp. 685-686.

Turberfield, A.J., "Photonic Crystals Made by Holographic Lithography", *MRS Bulletin*, 2001, pp. 632-636.

Vlasov et al., "Symposium O, Microphotonics III—Materials and Applications", Dec. 15, 2002, pp. 367-368.

Vlasov et al., "On-Chip Natural Assembly of Silicon Photonic Bandgap Crystals", *Letters to Nature*, 2001, vol. 414, pp. 289-293.

Wakabayashi, K. et al., "Studies on s-Triazines. I. Cotrimerization of Trichloroacetonitrile with Other Nitriles", *Bulletin of the Chemical Society of Japan*, 1969, vol. 42, pp. 2924-2930.

Witzgall, G. et al., "Single-Shot Two-Photon Exposure of Commercial Photoresist for the Production of Three-Dimensional Structures", *Optics Letters*, 1998, vol. 23, No. 22, pp. 1745-1747.

Xu, C. et al., "Meaurement of Two-Photon Excitation Cross Sections of Molecular Fluorophores with Data from 690 to 1050 nm", *J. Opt. Soc. Am. B.*, 1996, vol. 13, No. 3, pp. 481-491.

Yablonovitch, E. et al., "Photonic Band Structure: Non-Spherical Atoms in the Face-Centered-Cubic Case", *Physica B*, 1991, vol. 175, pp. 81-86.

Yablonovitch, "Photonic Crystals Semiconductors of Light", *Scientific American*, 2001, pp. 48-55.

Yang, S. et al., "Creating Periodic Three-Dimensional Structures by Multibeam Interference of Visible Laser", *Chemistry of Materials*, 2002, vol. 14, No. 7, pp. 2831-2833.

Zhou, W. et al., "An Efficient Two-Photon-Generated Photoacid Applied to Positive-Tone 3D Microfabrication", *Science*, 2002, vol. 296, pp. 1106-1109.

D.N. Sharp et al., "Photonic Crystals By Hologrphic Lithography: Design and Devices", Materials Research Society Meeting Proceedings (Boston, MA), Dec. 5, 2002, pp. 367-368.

K. Saravanamuttu et al., "Sol Gel Derived Silica-Acrylate Composites for 3D Holographic Lithography of Photonic Crystals", Materials Research Society Meeting Proceedings (Boston, MA), Dec. 5, 2002, p. 368.

* cited by examiner

PROCESS FOR PRODUCING PHOTONIC CRYSTALS AND CONTROLLED DEFECTS THEREIN

FIELD

This invention relates to processes for producing periodic dielectric structures and defects therein.

BACKGROUND

Photonic crystals, the photonic analog of traditional semiconductors, are currently the subject of intense investigation for applications in integrated optics. Such crystals is exhibit a photonic bandgap (analogous to the electronic bandgap of semiconductors) that determines which photon wavelengths can propagate through the crystal. By introducing specific defects into the crystal's bandgap structure, the flow of photons inside the crystal can be manipulated and a variety of micrometer-scale optical devices fabricated.

In particular, it is postulated that a three-dimensional (3-D) photonic crystal with appropriate line defects will act as a low-loss waveguide device, enabling light to be turned through a 90-degree bend without significant scattering losses. Such a device would be potentially useful in increasing the density of components on an optical chip and in chip-to-back plane applications. Other potential device applications include use in optical interconnects, optical switches, couplers, isolators, multiplexers, tunable filters, and low-threshold emitters.

Various methods have been used to produce photonic crystals. Such methods include, for example, colloidal crystal self-assembly methods, self-assembly of block copolymers, semiconductor-based lithography (for example, photolithography, masking, and etching), mechanical production of an array of holes in a substrate material (or, alternatively, mechanical removal of substrate material to form a periodic pattern of cylindrical or similarly-shaped rods of substrate material), electrochemical production of pore arrays in a substrate material, photofabrication using multibeam interference (MBI) or holographic lithography techniques, glancing angle deposition, and multi-photon photofabrication. Each method has its own advantages. Generally, however, all but MBI suffer from one or more of the following disadvantages: relatively high inherent structural disorder or defect concentrations, relatively slow deposition speeds, and numerous requisite process steps.

In contrast, MBI techniques enable the production of photonic crystals of various different Bravais lattice structures at relatively high speeds and using only a few process steps. The resulting photonic crystals typically exhibit exceptional order and structural fidelity.

Generally, organic photoresists have been used for MBI, but most conventional organic photopolymers have refractive indices that are substantially less than two and lack sufficient thermal stability to remain intact during, for example, the chemical vapor deposition (CVD) process that is often used to deposit high refractive index semiconductor (for silicon, typically temperatures above 500° C.). Such deficiencies make it difficult or impossible to achieve the high refractive index contrast ratios capable of supporting a complete photonic bandgap.

SUMMARY

Thus, we recognize that there is a need for a process for producing photonic crystals (and controlled or engineered defects therein) that can provide high refractive index contrast periodic dielectric structures. Briefly, in one aspect, this invention provides such a process, which comprises (a) providing a substantially inorganic photoreactive composition comprising (1) at least one cationically reactive species (preferably, at least one cationically curable species), (2) a multi-photon photoinitiator system (preferably, a multi-component multi-photon photoinitiator system), and (3) a plurality of precondensed, inorganic nanoparticles;

(b) exposing, using a multibeam interference technique involving at least three beams, at least a portion of the photoreactive composition to radiation of appropriate wavelength, spatial distribution, and intensity to produce a two-dimensional or three-dimensional periodic pattern of reacted and non-reacted portions of the photoreactive composition;

(c) exposing at least a portion of the non-reacted portion of the photoreactive composition to radiation of appropriate wavelength and intensity to cause multi-photon absorption and photoreaction to form additional reacted portion and a remaining non-reacted portion;

(d) removing the remaining non-reacted portion or the entire reacted portion (preferably, the remaining non-reacted portion) of the photoreactive composition to form interstitial void space; and (e) at least partially filling the interstitial void space with at least one material having a refractive index that is different from the refractive index of the remaining non-reacted or reacted portion of the photoreactive composition.

Unlike conventional MBI processes that use organic materials, the process of the invention utilizes a substantially inorganic photoreactive composition to produce thermally stable, robust, highly ordered periodic dielectric structures that can withstand temperatures up to, for example, about 600 to 1300° C. The refractive index contrast of the structures can therefore be enhanced, for example, through semiconductor CVD, optionally followed by removal of the structure (by, for example, hydrogen fluoride etching) to produce air voids. The use of cationically reactive species can enable multiple exposures without a significant change in refractive index, and the use of precondensed, inorganic nanoparticles can provide surprisingly reduced shrinkage (relative to corresponding compositions comprising uncondensed metal oxide precursors).

Thus, the process of the invention not only meets the need for a process that can provide high refractive index contrast periodic dielectric structures containing controlled or engineered defects to selectively route and control light propagation through the structure, but also facilitates optimization of the optical properties of the structure. The resulting defect-containing structures can be used, for example, in planar lightwave circuits.

BRIEF DESCRIPTION OF THE DRAWINGS

These and other features, aspects, and advantages of the present invention will become better understood with regard to the following description, appended claims, and accompanying drawings, wherein:

FIG. 1a shows a substantially inorganic photoreactive composition 10 borne on a substrate 20;

FIG. 1b shows at least a portion of composition 10 of FIG. 1a being exposed using a multibeam interference apparatus 30;

FIG. 1c shows a resulting two-dimensional or three-dimensional periodic pattern of exposed and non-exposed portions (32 and 36, respectively) of composition 10 after exposure in FIG. 1b;

FIG. 1d shows a laser beam 40 being focused by a lens 44 to a pinpoint 42 inside the periodic pattern of FIG. 1c;

FIG. 1e shows the result of moving the position of pinpoint 42 of FIG. 1d in a desired pattern to form additional exposed portion 46 of composition 10;

FIG. 1f shows void space 50 created by removal of non-exposed portion 36 of composition 10 after the exposure of FIG. 1e;

FIG. 1g shows void space 50 of FIG. 1f filled with a relatively high refractive index material 52; and FIG. 1h shows the filled structure of FIG. 1g after exposure to an etchant that selectively removed the remaining exposed portion of composition 10 and left high refractive index material 52 essentially intact, so as to form a structure 60 comprising high refractive index material 52 with 3-dimensionally periodic air-filled voids 64 and a non-periodic, engineered air defect 66.

Figure 1A:
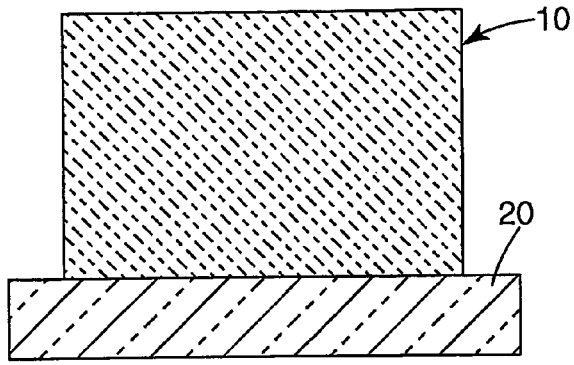
FIGS. 1a-1h show, in sectional view, an embodiment of the process of the invention.
Figure 1B:
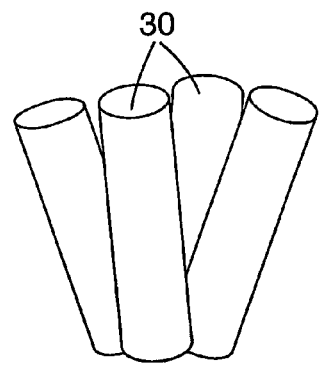
Figure 1B:
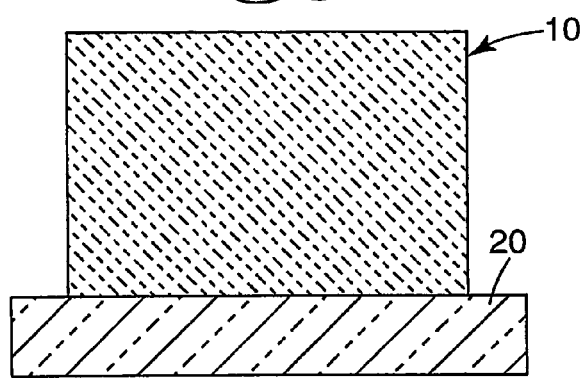
Figure 1C:
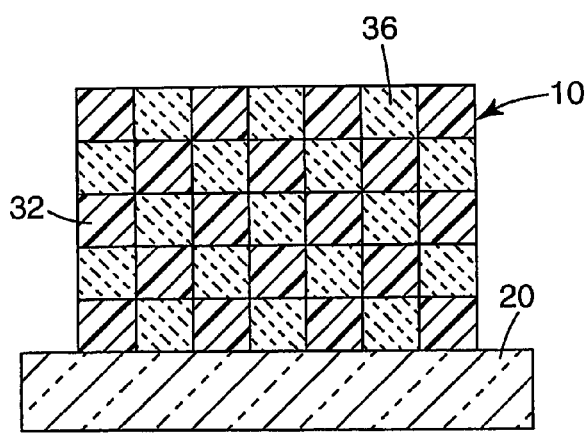

These figures, which are idealized, are not drawn to scale and are intended to be merely illustrative and nonlimiting.

DETAILED DESCRIPTION

Definitions

As used in this patent application:

"periodic dielectric structure" means a structure that exhibits a periodic spatial variation in dielectric constant;

"photonic bandgap" (PBG) means a range of frequencies or wavelengths at which electromagnetic radiation cannot propagate in some (a "partial photonic bandgap") or all (a "complete photonic bandgap") directions in a periodic dielectric structure;

"substantially inorganic photoreactive composition" means a photoreactive composition that, upon photoreaction and pyrolysis, loses less than about 80 percent of its initial weight; and "precondensed" (in reference to an inorganic nanoparticle) means that the nanoparticle has a density that is substantially the same as that of the corresponding bulk material.

Substantially Inorganic Photoreactive Composition

Photoreactive compositions useful in the process of the invention are substantially inorganic in nature, so as to generally be thermally stable under the conditions commonly used in fabricating photonic crystals (for example, temperatures up to about 600 to 1300° C.). Upon photoreaction and pyrolysis, such compositions lose less than about 80 percent (preferably, less than about 60 percent; more preferably, less than about 40 percent; most preferably, less than about 30 percent) of their initial weight.

Suitable compositions include compositions comprising (1) at least one cationically reactive species (preferably, at least one cationically curable species); (2) a multi-photon photoinitiator system (preferably, a multi-component multi-photon photoinitiator system); and (3) a plurality of precondensed, inorganic particles. The compositions can optionally further comprise non-reactive species (for example, non-reactive polymeric binders).

It is preferable that the compositions exhibit volume shrinkage of less than about 20 percent upon photoreaction. Preferably, at least a portion of the cationically reactive species utilized are multifunctional.

(1) Cationically Reactive Species

Suitable cationically reactive species include curable and non-curable species. Curable species are generally preferred and include, for example, those that are organic (for example, an epoxy) or hybrid organic/inorganic (for example, glycidyloxypropyltrimethoxysilane and oligomers thereof) in nature. Useful curable species include cationically-polymerizable monomers and oligomers and cationically-crosslinkable polymers (including, for example, epoxies, vinyl ethers, and cyanate esters), and the like. The use of cationically curable species makes possible the formation of a latent image of photoacid in exposed regions without substantially changing the refractive index of the composition. This can be preferred for processes involving multiple exposures prior to curing and development.

Useful non-curable species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehyde-based materials); and rearrangement (for example, materials based on the pinacol rearrangements).

Mixtures of different types of reactive species can be utilized in the photoreactive compositions. For example, mixtures of free-radically-reactive species and cationically-reactive species, mixtures of organic and hybrid organic/inorganic reactive species, mixtures of curable species and non-curable species, and so forth, are also useful.

(i) Organic Cationically Reactive Species

Organic cationically reactive species can be utilized in the photoreactive compositions. Suitable organic cationically reactive species include cationically-curable species. Mixtures of two or more monomers, oligomers, and/or reactive polymers can be used if desired.

Suitable cationically-curable species are described, for example, in U.S. Pat. Nos. 5,998,495 and 6,025,406 and include epoxy resins. Such materials, broadly called epoxides, include monomeric epoxy compounds and epoxides of the oligomeric type and can be aliphatic, alicyclic, aromatic, or heterocyclic. These materials generally have, on the average, at least 1 polymerizable epoxy group per molecule (preferably, at least about 1.5 and, more preferably, at least about 2). The oligomeric epoxides include linear oligomers having terminal epoxy groups (for example, a diglycidyl ether of a polyoxyalkylene glycol), oligomers having skeletal epoxy units (for example, polybutadiene polyepoxide), and oligomers having pendant epoxy groups (for example, a glycidyl methacrylate oligomer or co-oligomer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. Carbide Corp.), bis(3,4-epoxy-6-methylcyclohexylmethyl) adipate (for example, the compounds available under the trade designation ERL 4289 from Union Carbide Corp.), bis(2,3-epoxycyclopentyl) ether (for example, the compounds available under the trade designation ERL 0400 from Union Carbide Corp.), aliphatic epoxy modified from polypropylene glycol (for example, those available under the trade designations ERL 4050 and ERL 4052 from Union Carbide Corp.), dipentene dioxide (for example, the compounds available under the trade designation ERL 4269 from Union Carbide Corp.), epoxidized polybutadiene (for example, the compounds available under the trade designations Oxiron 2001 from FMC Corp.), silicone resin containing epoxy functionality, resorcinol diglycidyl ether (for example, the compounds available under the trade designation KOPOXITE from Koppers Company, Inc.), bis(3,4-epoxycyclohexyl)adipate (for example, those available under the trade designations ERL 4299 or UVR 6128, from Union Carbide Corp.), 2-(3,4-epoxycyclohexyl-5,5-spiro-3,4-epoxy) cyclohexane-meta-dioxane (for example, the compounds available under the trade designation ERL-4234 from Union Carbide Corp.), vinylcyclohexene monoxide, 1,2-epoxyhexadecane (for example, the compounds available under the trade designation UVR-6216 from Union Carbide Corp.), alkyl glycidyl ethers such as alkyl $C_8$-$C_{10}$ glycidyl ether (for example, those available under the trade designation HELOXY MODIFIER 7 from Resolution Performance Products), butyl glycidyl ether (for example, those available under the trade designation HELOXY MODIFIER 61 from Resolution Performance Products), polyfunctional glycidyl ethers such as diglycidyl ether of 1,4-butanediol (for example, HELOXY MODIFIER 67 from Resolution Performance Products), diglycidyl ether of cyclohexanedimethanol (for example, HELOXY MODIFIER 107 from Resolution Performance Products), trimethylol ethane triglycidyl ether (for example, HELOXY MODIFIER 44 from Resolution Performance Products), polyglycidyl ether of an aliphatic polyol (for example, HELOXY MODIFIER 84 from Resolution Performance Products), polyglycol diepoxide (for example, HELOXY MODIFIER 32 from Resolution Performance Products), and bisphenol F epoxides (for example, those available under the trade designations EPON 1138 from Resolution Performance Products and GY-281 from Ciba-Geigy Corp.).

Other useful epoxy resins comprise copolymers of acrylic acid esters of glycidol (such as glycidyl acrylate and glycidyl methacrylate) with one or more copolymerizable vinyl compounds. Examples of such copolymers are 1:1 styrene-glycidyl methacrylate and 1:1 methyl methacrylate-glycidyl acrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717, which are commercially available from the General Electric Company. These are polydimethylsiloxanes in which 1-20 mole % of the silicon atoms have been substituted with epoxyalkyl groups (preferably, epoxy cyclohexylethyl, as described in U.S. Pat. No. 5,753,346.

Blends of various epoxy-containing materials can also be utilized. Such blends can comprise two or more weight average molecular weight distributions of epoxy-containing compounds (such as low molecular weight (below 200), intermediate molecular weight (about 200 to 1000), and higher molecular weight (above about 1000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the EPON resins available from Resolution Performance Products) and cycloaliphatic epoxies (such as ERL 4221 and ERL 4299 available from Union Carbide).

Suitable cationically-curable species also include vinyl ether monomers and oligomers (for example, methyl vinyl ether, ethyl vinyl ether, tert-butyl vinyl ether, isobutyl vinyl ether, triethyleneglycol divinyl ether (for example, those available under the trade designation RAPI-CURE DVE-3 from International Specialty Products, Wayne, N.J.), trimethylolpropane trivinyl ether (for example, those available under the trade designation TMPTVE from BASF Corp., Mount Olive, N.J.), and those available under the trade designation VECTOMER divinyl ether resins from Allied Signal (for example, VECTOMER 2010, VECTOMER2020, VECTOMER4010, and VECTOMER 4020 and their equivalents available from other manufacturers), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

(ii) Hybrid Organic/Inorganic Cationically Reactive Species

Hybrid organic/inorganic cationically reactive species can be used in the photoreactive compositions. Useful hybrid organic/inorganic cationically reactive species include silane compounds that have at least one cationically polymerizable organic group. Examples of such silanes include, for example, epoxysilane compounds (such as glycidyloxytrimethoxysilane, bis(glycidyloxy)dimethoxysilane, β-(3,4-epoxycyclohexyl)ethyltrimethoxysilane, β-(3,4epoxycyclohexyl)ethyltriethoxysilane, and the like), oxetanesilane compounds (such as 3-(3-methyl-3-oxetanemethoxy)propyltrimethoxysilane, 3-(3-methyl-3-oxetanemethoxy)propyltrimethoxysilane, and the like), silane compounds having a 6-membered ring ether structure (such as oxacyclohexyltrimethoxysilane, oxacyclohexyltrimethoxysilane, and the like), and other reactive silanes capable of multi-photon activated cationic photocuring. Hydrolysates of such silane compounds can also be used.

Condensates of photoreactive silane compounds and/or condensates of mixtures of reactive and non-reactive silanes (for example, polyoctahedral silsesquioxanes and oligomeric and polymeric silsesquioxane materials available from suppliers such as Hybrid Plastics, Gelest, Techneglas, and Aldrich Chemical Co.), oligomeric siloxane materials (for example, polydimethylsiloxane), and branched and hyperbranched silicon-containing oligomeric and polymeric materials can be used in combination with the above-described silane compounds, if desired. Sol-gel materials (for example, silicon alkoxides) can also be used in combination with the silane compounds to increase the inorganic content of the final cured composition.

(2) Multi-photon Photoinitiator System

The photoinitiator system can be a multi-photon photoinitiator system, as the use of such systems enables enhanced contrast as well as defect writing in 3-dimensional periodic dielectric structures. Such a system preferably is a two- or three-component system that comprises at least one multi-photon photosensitizer, at least one electron acceptor, and, optionally, at least one electron donor. Such multi-component The molecular weight of the epoxy-containing materials can vary from about 58 to about 500 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula

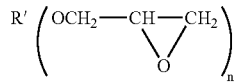

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidyl methacrylate, diglycidyl ethers of Bisphenol A (for example, those available under the trade designations EPON 828 and EPON 825 from Resolution Performance Products, formerly Shell Chemical Co., as well as those available under the trade designation DER from Dow Chemical Co.), vinylcyclohexene dioxide (for example, the compounds available under the trade designations ERL 4206 from Union Carbide Corp.), 3,4-epoxy-cyclohexylmethyl-3,4-epoxycyclohexene carboxylate (for example, the compounds available under the trade designations ERL 4221, Cyracure UVR 6110 or UVR 6105 from Union Carbide Corp.), 3,4-epoxy-6-methylcyclohexylm-ethyl-3,4-epoxy-6-methyl-cyclohexene carboxylate (for example, the compounds available under the trade designation ERL 4201 from Union component systems can provide enhanced sensitivity, enabling photoreaction to be effected in a shorter period of time and thereby reducing the likelihood of problems due to movement of the sample and/or one or more components of the exposure system.

Alternatively, the multi-photon photoinitiator system can be a one-component system that comprises at least one photoinitiator. Photoinitiators useful as one-component multi-photon photoinitiator systems include stilbene derivatives with covalently attached sulfonium salt moeties (for example, those described by W. Zhou et al. in Science 296, 1106 (2002)). Other conventional ultraviolet (UV) cationic photoinitiators can also be utilized, although their multi-photon photoinitiation sensitivities will generally be relatively low.

Multi-photon photosensitizers, electron acceptors, and electron donors useful in two- and three-component photoinitiator systems are described below.

(i) Multi-photon Photosensitizers

Multi-photon photosensitizers suitable for use in the photoreactive composition are capable of simultaneously absorbing at least two photons when exposed to radiation from an appropriate light source in an exposure system. Preferred multi-photon photosensitizers have a two-photon absorption cross-section greater than that of fluorescein (that is, greater than that of 3', 6'-dihydroxyspiro[isobenzofuran-1(3H),9'-[9H]xanthen]3-one) when measured at the same wavelength.

Generally, the two-photon absorption cross-section can be greater than about $50 \times 10^{-50}$ cm$^4$ sec/photon, as measured by the method described by C. Xu and W. W. Webb in J. Opt. Soc. Am. B, 13, 481 (1996) and WO 98/21521. This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well-known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules*, Second Edition, pages 24-27, Academic Press, New York (1971); by J. N. Demas and G. A. Crosby in J. Phys. Chem. 75, 991-1024 (1971); and by J. V. Morris, M. A. Mahoney, and J. R. Huber in J. Phys. Chem. 80, 969-974 (1976).

Assuming that the emitting state is the same under one- and two-photon excitation (a common assumption), the two-photon absorption cross-section of the photosensitizer, ($\delta_{sam}$), is equal to $\delta_{ref} K (I_{sam}/I_{ref})(\Phi_{sam}/\Phi_{ref})$, wherein $\delta_{ref}$ is the two-photon absorption cross-section of the reference compound, $I_{sam}$ is the fluorescence intensity of the photosensitizer, $I_{ref}$ is the fluorescence intensity of the reference compound, $\Phi_{sam}$ is the fluorescence quantum efficiency of the photosensitizer, $\Phi_{ref}$ is the fluorescence quantum efficiency of the reference compound, and K is a correction factor to account for slight differences in the optical path and response of the two detectors. K can be determined by measuring the response with the same photosensitizer in both the sample and reference arms. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregation effects).

When the photosensitizer is not fluorescent, the yield of electronic excited states can be measured and compared with a known standard. In addition to the above-described method of determining fluorescence yield, various methods of measuring excited state yield are known (including, for example, transient absorbance, phosphorescence yield, photoproduct formation or disappearance of photosensitizer (from photoreaction), and the like).

Preferably, the two-photon absorption cross-section of the photosensitizer is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the multi-photon photosensitizer is soluble in the reactive species (if the reactive species is liquid) or is compatible with the reactive species and with any binders (as described below) that are included in the multi-photon reactive composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313 and outlined below.

Using currently available materials, that test can be carried out as follows: A standard test solution can be prepared having the following composition: 5.0 parts of a 5% (weight by volume) solution in methanol of 45,000-55,000 molecular weight, 9.0-13.0% hydroxyl content polyvinyl butyral (for example, those available under the trade designation BUTVAR B76 from Monsanto); 0.3 parts trimethylolpropane trimethacrylate; and 0.03 parts 2-methyl-4,6-bis(trichloromethyl)-s-triazine (see Bull. Chem. Soc. Japan, 42, 2924-2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (such as that produced from a FCH 650 W quartz-iodine lamp, available from General Electric). Exposure can be made through a stencil to provide exposed and non-exposed areas in the construction. After exposure the cover film can be removed, and the coating can be treated with a finely divided colored powder, such as a color toner powder of the type conventionally used in xerography. If the tested compound is a photosensitizer; the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, non-exposed areas of the coating, providing a visual image corresponding to that in the stencil.

Preferably, a multi-photon photosensitizer can also be selected based in part upon shelf stability considerations. Accordingly, selection of a particular photosensitizer can depend to some extent upon the particular reactive species utilized (as well as upon the choices of electron donor compound and/or electron acceptor).

Useful multi-photon photosensitizers include semiconductor nanoparticle quantum dots that have at least one electronic excited state that is accessible by absorption of two or more photons. Particularly preferred multi-photon photosensitizers include more conventional photosensitizers exhibiting large multi-photon absorption cross-sections, such as Rhodamine B (that is, N-[9-(2-carboxyphenyl)-6-(diethylamino)-3H-xanthen-3-ylidene]-N-ethylethanaminium chloride and the hexafluoroantimonate salt of Rhodamine B) and the four classes of photosensitizers described, for example, by Marder and Perry et al. WO 98/21521 and WO 99/53242. The four classes can be described as follows: (a) molecules in which two donors are connected to a conjugated π-electron bridge; (b) molecules in which two donors are connected to a conjugated π-electron bridge which is substituted with one or more electron accepting groups; (c) molecules in which two acceptors are connected to a conjugated π-electron bridge; and (d) molecules in which two acceptors are connected to a conjugated π-electron bridge which is substituted with one or more electron donating groups (where "bridge" means a molecular fragment that connects two or more chemical groups, "donor" means an atom or group of atoms with a low ionization potential that can be bonded to a conjugated π-electron bridge, and "acceptor" means an atom or group of atoms with a high electron affinity that can be bonded to a conjugated π-electron bridge).

Representative examples of such photosensitizers include the following:

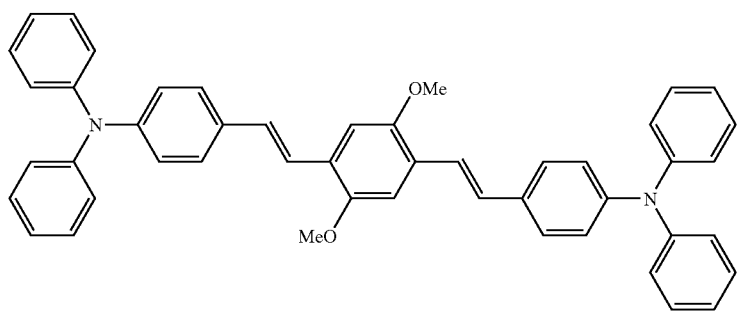

-continued
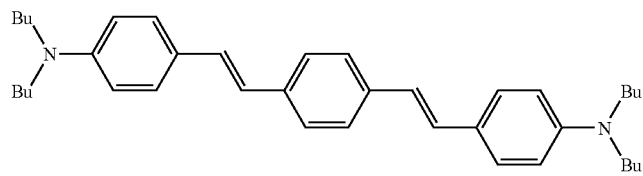
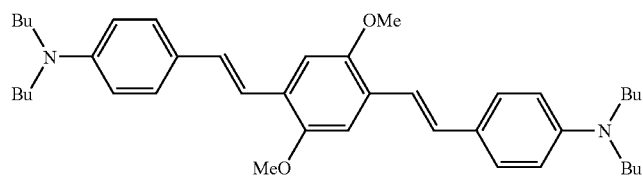
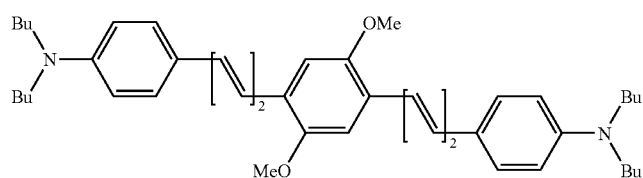
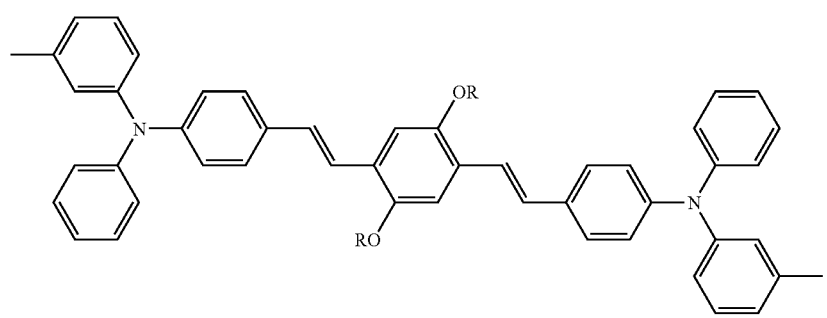
R = C_{12}H_{25}
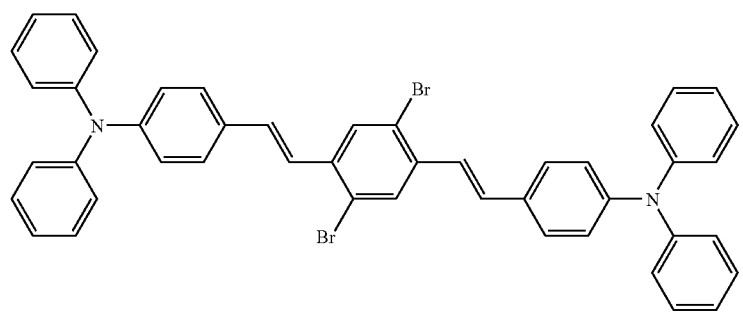
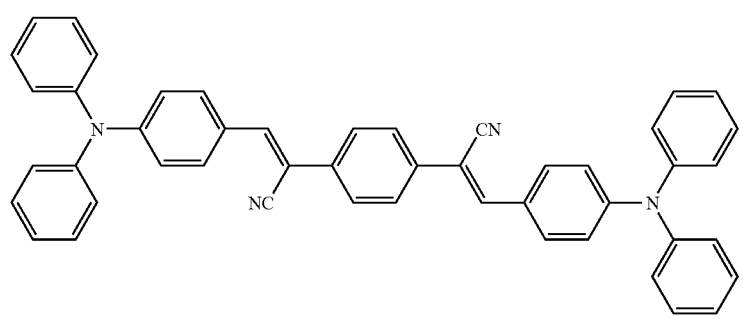
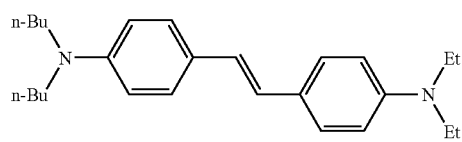

-continued
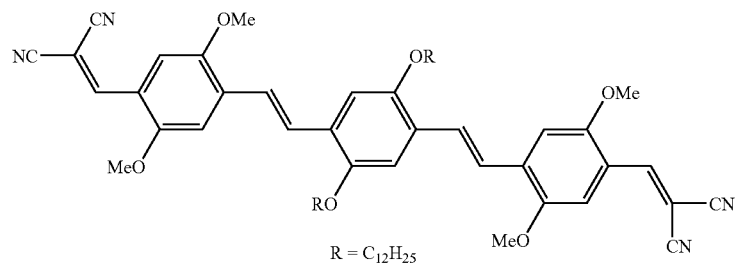
R = C₁₂H₂₅
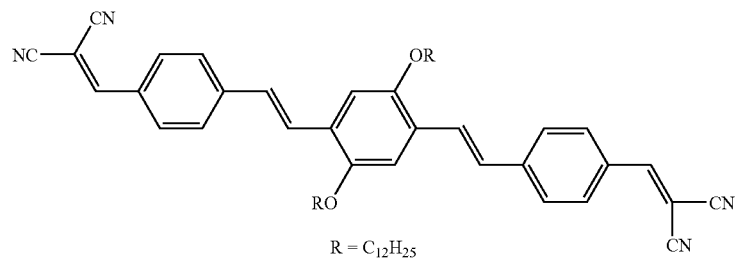
R = C₁₂H₂₅
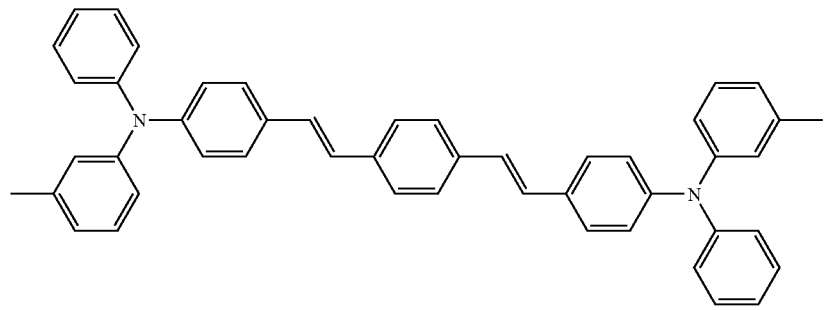
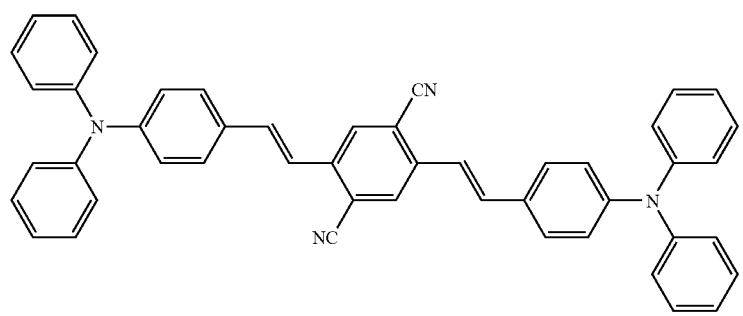
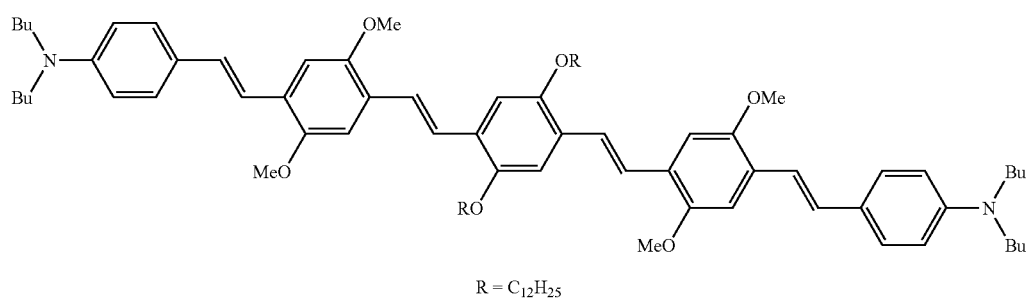
R = C₁₂H₂₅
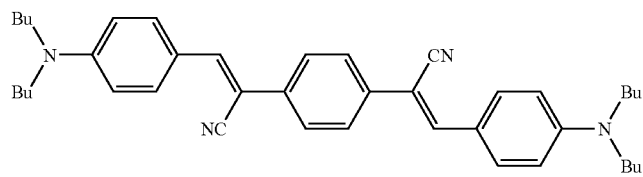
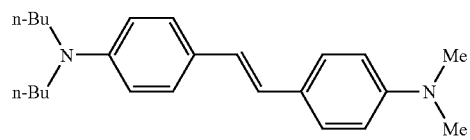

-continued
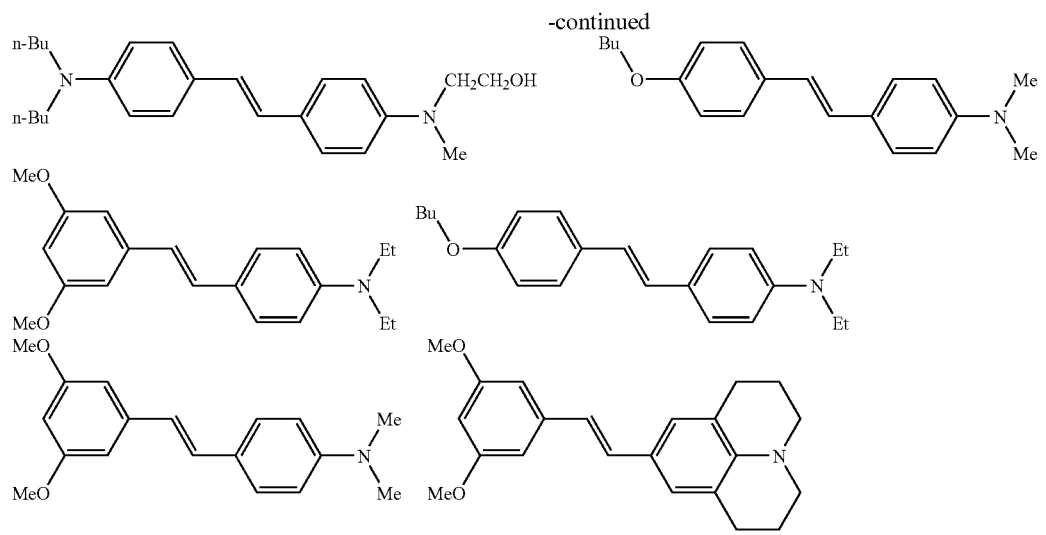
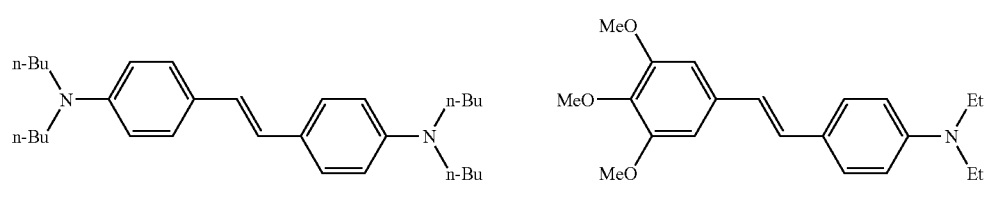
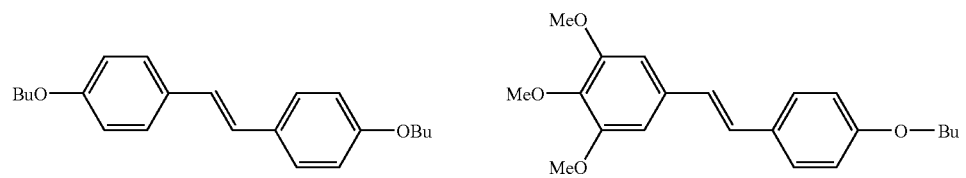
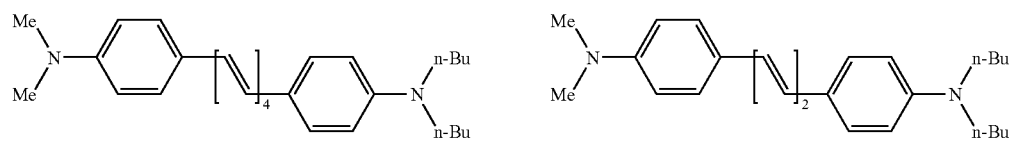
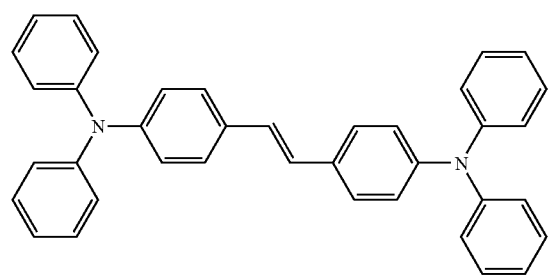
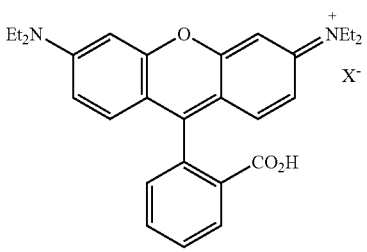
where X⁻ = Cl⁻, $PF_6^-$, $SbF_6^-$, $AsF_6^-$, $BF_4^-$, $CF_3SO_3^-$ The four classes of photosensitizers described above can be prepared by reacting aldehydes with ylides under standard Wittig conditions or by using the McMurray reaction, as detailed in WO 98/21521.

Other suitable compounds are described in U.S. Pat. Nos. 6,100,405, 5,859,251, and 5,770,737 as having large multi-photon absorption cross-sections, although these cross-sections were determined by a method other than that described above. Representative examples of such compounds include the following:

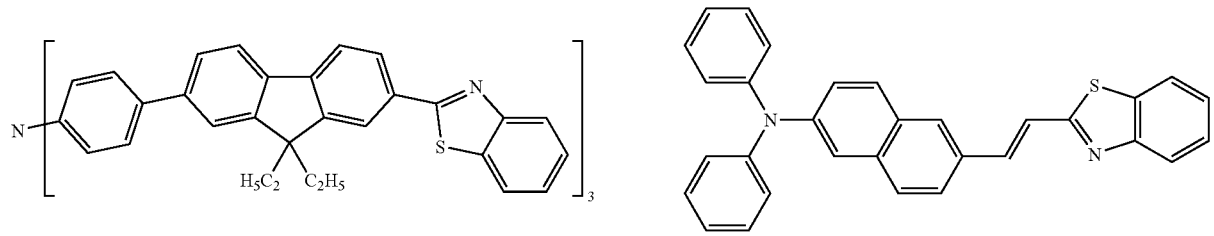

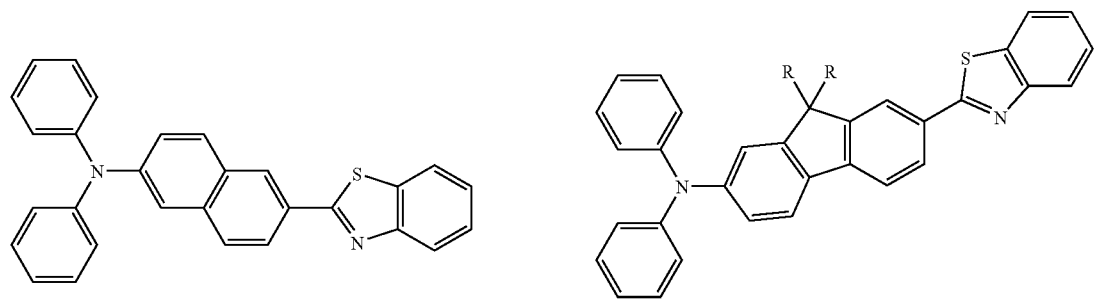

R = R = C2H5, C10H21, C18H37

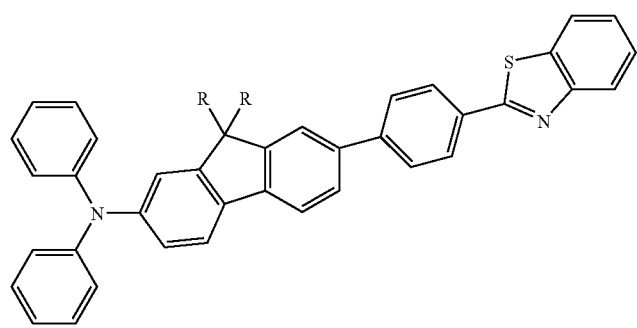

R = C$_2$H$_5$

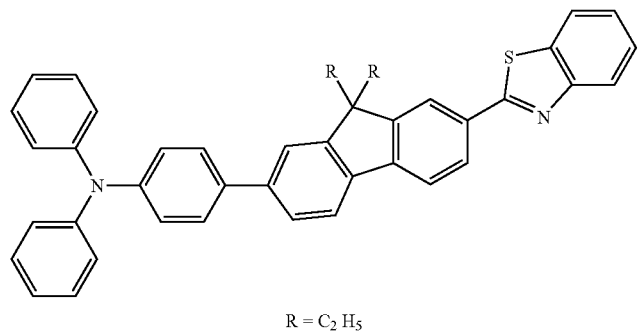

R = C$_2$H$_5$

-continued

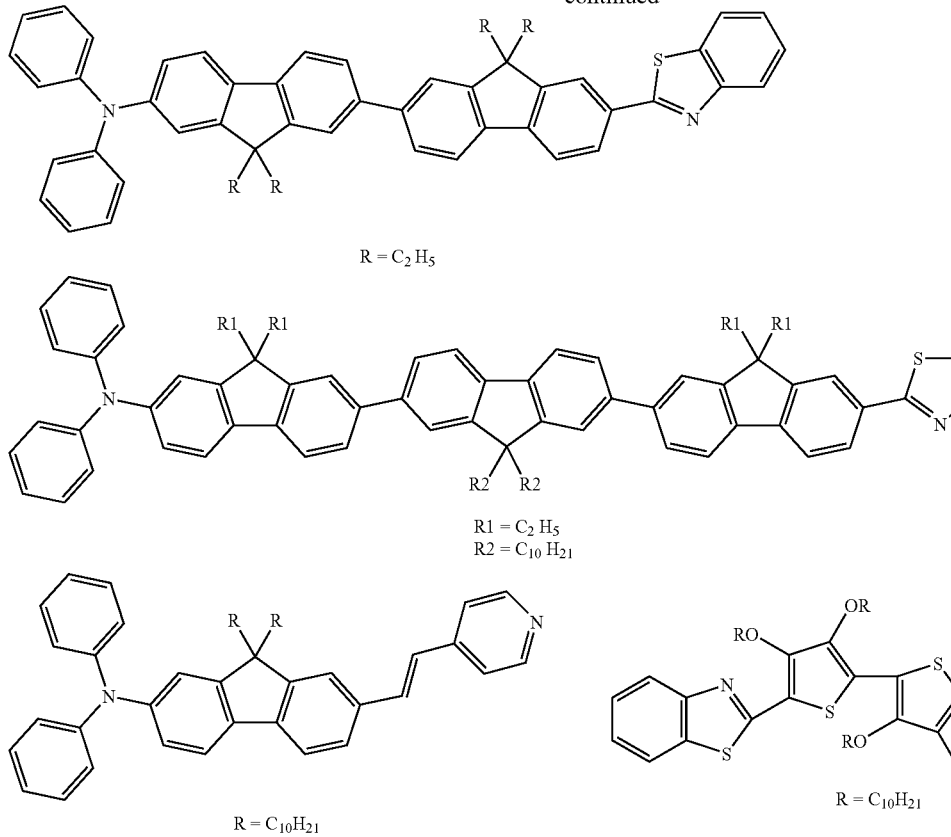

(ii) Electron Acceptor Compounds

Suitable electron acceptors for use in the photoreactive compositions are capable of being photosensitized by accepting an electron from an electronic excited state of the multiphoton photosensitizer, resulting in the formation of at least one acid. Such electron acceptors include iodonium salts (for example, diaryliodonium salts), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), and the like, and mixtures thereof.

The electron acceptor is preferably soluble in the reactive species and is preferably shelf-stable (that is, does not spontaneously promote reaction of the reactive species when dissolved therein in the presence of the photosensitizer and an electron donor compound). Accordingly, selection of a particular electron acceptor can depend to some extent upon the particular reactive species, photosensitizer, and electron donor compound chosen, as described above.

Suitable iodonium salts include those described in U.S. Pat. Nos. 5,545,676, 3,729,313, 3,741,769, 3,808,006, 4,250,053 and 4,394,403. The iodonium salt can be a simple salt (for example, containing an anion such as $Cl^-$, $Br^-$, $I^-$ or $C_4H_5SO_3^-$) or a metal complex salt (for example, containing $SbF_6^-$, $PF_6^-$, $BF_4^-$, tetrakis(perfluorophenyl)borate, $SbF_5$ $OH^-$ or $AsF_6^-$). Mixtures of iodonium salts can be used if desired.

Examples of useful aromatic iodonium complex salt electron acceptors include diphenyliodonium tetrafluoroborate; di(4-methylphenyl)iodonium tetrafluoroborate; phenyl4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl) iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl) iodonium hexafluorophosphate; di(4-bromophenyl) iodonium hexafluorophosphate; di(4-methoxyphenyl) iodonium hexafluorophosphate; di(3-carboxyphenyl) iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, those available under the trade designation SARCAT SR 1012 from Sartomer Company), and mixtures thereof.

Suitable anions, $X^-$, for the sulfonium salts (and for any of the other types of electron acceptors) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5\text{-bis}(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5\text{-bis}(CF_3)C_6H_3)_4B^-$, $(C_6F_5)_4B^-$, $(p\text{-}CF_3C_6H_4)_4B^-$, $(m\text{-}CF_3C_6H_4)_4B^-$, $(p\text{-}FC_6H_4)_4B^-$, $(C_6F_5)_3(CH_3)B^-$, $(C_6F_5)_3(n\text{-}C_4H_9)B^-$, $(p\text{-}CH_3C_6H_4)_3(C_6F_5)B^-$, $(C_6F_5)_3FB^-$, $(C_6H_5)_3(C_6F_5)B^-$, $(CH_3)_2(p\text{-}CF_3C_6H_4)_2B^-$, $(C_6F_5)_3(n\text{-}C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5\text{-bis}(CF_3)C_6H_3)_4B^-$, $(C_6F_5)_4B^-$, $(C_6F_5)_3(n\text{-}C_4H_9)B^-$, $(C_6F_5)_3FB^-$, and $(C_6F_5)_3(CH_3)B^-$.

Suitable anions containing other metal or metalloid centers include, for example, $(3,5\text{-bis}(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F6As^-$. Preferably, the anion, $X^{31}$, is selected from tetrafluoroborate, hexafluorophosphate, hexafluoroarsenate, hexafluoroantimonate, and hydroxypentafluoroantimonate (for example, for use with cationically-curable species such as epoxy resins).

Examples of suitable sulfonium salt electron acceptors include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolyesulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxanthenium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, those available under the trade designation SARCAT SR1010 from Sartomer Company), triarylsulfonium hexafluorophosphate (for example, those available under the trade designation SARCAT SR 1011 from Sartomer Company), and triarylsulfonium hexafluorophosphate (for example, those available under the trade designation SARCAT KI85 from Sartomer Company).

Preferred electron acceptors include photoacid generators such as iodonium salts (more preferably, aryliodonium salts), sulfonium salts, and diazonium salts. More preferred are aryliodonium salts.

(iii) Electron Donor Compounds

Electron donor compounds useful in the photoreactive composition are compounds (other than the photosensitizer itself) that are capable of donating an electron to an electronic excited state of the photosensitizer. The electron donor compounds preferably have an oxidation potential that is greater than zero and less than or equal to that of p-dimethoxybenzene. Preferably, the oxidation potential is between about 0.3 and 1 V vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406.)

In general, electron donor compounds suitable for use with particular photosensitizers and electron acceptors can be selected by comparing the oxidation and reduction potentials of the three components (as described, for example, in U.S. Pat. No. 4,859,572). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II: Techniques of Chemistry*, Vol. V (1975), and C. K. Mann and K. K. Barnes, *Electrochemical Reactions in Nonaqueous Systems* (1970). The potentials reflect relative energy relationships and can be used in the manner described below to guide electron donor compound selection.

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The electron acceptor can accept the electron from the higher energy orbital, and the electron donor compound can donate an electron to fill the vacancy in the originally occupied orbital, provided that certain relative energy relationships are satisfied.

If the reduction potential of the electron acceptor is less negative (or more positive) than that of the photosensitizer, an electron in the higher energy orbital of the photosensitizer is readily transferred from the photosensitizer to the lowest unoccupied molecular orbital (LUMO) of the electron acceptor, since this represents an exothermic process. Even if the process is instead slightly endothermic (that is, even if the reduction potential of the photosensitizer is up to 0.1 volt more negative than that of the electron acceptor) ambient thermal activation can readily overcome such a small barrier.

In an analogous manner, if the oxidation potential of the electron donor compound is less positive (or more negative) than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 V more positive than that of the electron donor compound), ambient thermal activation can readily overcome such a small barrier.

Slightly endothermic reactions in which the reduction potential of the photosensitizer is up to 0.1 V more negative than that of the electron acceptor, or the oxidation potential of the photosensitizer is up to 0.1 V more positive than that of the electron donor compound, occur in every instance, regardless of whether the electron acceptor or the electron donor compound first reacts with the photosensitizer in its excited state. When the electron acceptor or the electron donor compound is reacting with the photosensitizer in its excited state, it is preferred that the reaction be exothermic or only slightly endothermic. When the electron acceptor or the electron donor compound is reacting with the photosensitizer ion radical, exothermic reactions are still preferred, but still more endothermic reactions can be expected in many instances to occur. Thus, the reduction potential of the photosensitizer can be 0.2 V or more, more negative than that of a second-to-react electron acceptor, or the oxidation potential of the photosensitizer can be 0.2 V or more, more positive than that of a second-to-react electron donor compound.

Suitable electron donor compounds include, for example, those described by D. F. Eaton in *Advances in Photochemistry*, edited by B. Voman et al., Volume 13, pp. 427-488, John Wiley and Sons, New York (1986); and in U.S. Pat. Nos. 6,025,406, and 5,545,676. Such electron donor compounds include amines (including, triphenylamine (and its triphenylphosphine and triphenylarsine analogs) and aminoaldehydes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, $(allyl)Sn(CH_3)_3$, and $(benzyl)Sn(n-C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include aryl-, alkaryl- and aralkyl-amines (for example, p-N,N-dimethylaminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Suitable ether electron donor compounds include 4.4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

If desired, the electron donor, the electron acceptor, or both can be tethered (for example, covalently) to the multi-photon photosensitizer.

(3) Inorganic Nanoparticles

Particles suitable for use in the process of the invention include those that are precondensed and inorganic in chemical composition. Such precondensed particles generally have a density that is substantially the same as that of the corresponding bulk material (preferably, at least about 50 percent, more preferably, at least about 70 percent, most preferably, at least about 90 percent, of the density of the corresponding bulk material). Upon heating to a temperature of about 200° C., such particles generally retain at least about 70 percent of their original weight (preferably, at least about 80 percent; more preferably, at least about 90 percent).

The particles can be surface-treated (for example, so as to bear surface-attached organic groups), if desired. Preferably, the particles can be selected so as to not initiate reaction of the cationically reactive species, or can be surface treated so as to minimize any such initiation. Generally, the particles can be submicron in size and, if used at concentrations greater than about 10% by weight in the composition, largely transparent at the wavelength of light used for photoreaction of the photoreactive composition. Preferably, the refractive index of the particles is substantially the same as that of the reactive species (for example, within about ten percent).

Suitable particles are described, for example, in U.S. Pat. No. 5,648,407, the description of which is incorporated herein by reference. Suitable particles include but are not limited to particles of metal oxides (such as $Al_2O_3$, $ZrO_2$, $TiO_2$, ZnO, $SiO_2$, rare earth oxides, and silicate glasses) and metal carbonates, as well as other sufficiently transparent non-oxide ceramic materials (for example, metal fluorides). An additional consideration in choosing the particle(s) can be the temperature at which the material comprising the particle can be sintered into a dense inorganic structure. Preferably, the particles are acid etchable (for example, etchable by aqueous HF or HCl).

Colloidal silica is the preferred particle for use in the process of the invention, but other colloidal metal oxides (for example, titania, alumina, zirconia, vanadia, antimony oxide, tin oxide, and the like, and mixtures thereof) can also be utilized. The colloidal particles can include essentially a single oxide with sufficient transparency, such as silica, or can include a core of an oxide of one type (or a core of a material other than a metal oxide) on which is deposited an oxide of another type, preferably silica. Alternatively, the colloidal particles can be composed of clusters of smaller particles (of like or different composition), can be hollow, or can be porous.

Generally, the particles or clusters are smaller than the wavelength of light used for photopatterning the photoreactive composition and can range in size (average particle diameter, where "diameter" refers not only to the diameter of substantially spherical particles but also to the longest dimension of non-spherical particles) from about 1 nanometer to about 150 nanometers, preferably from about 5 nanometers to about 75 nanometers, more preferably from about 5 nanometers to about 30 nanometers, most preferably from about 5 nanometers to about 20 nanometers. Incorporation of colloidal particles having the specified size range into the photoreactive composition generally yields a substantially clear, homogeneous composition. Such compositions minimize scattering of light during the photopatterning process. Most preferably, the particles are not only of such sizes but also have a refractive index that is substantially the same as that of the selected reactive species.

It will be apparent to one skilled in the art that certain types of inorganic particles can interact with components of the multi-photon photoinitiator system (for example acting as an electron acceptor) and interfere with the multi-photon-photoinitiated photoreaction. The combination of inorganic particles and multi-photon photoinitiators can preferably be chosen to avoid such interference.

It is also preferable that the particles be relatively uniform in size and remain substantially non-aggregated, as particle aggregation can result in precipitation, gellation, or a dramatic increase in sol viscosity. Photoreactive compositions including particles having a substantially monodisperse or a substantially bimodal size distribution are preferred.

Thus, a particularly desirable class of particles for use in the process of the invention includes sols of inorganic particles (for example, colloidal dispersions of inorganic particles in liquid media), especially sols of amorphous silica. Such sols can be prepared by a variety of techniques and in a variety of forms, which include hydrosols (where water serves as the liquid medium), organosols (where organic liquids are used), and mixed sols (where the liquid medium includes both water and an organic liquid). See, for example, the descriptions of the techniques and forms given in U.S. Pat. No. 2,801,185 (Iler) and U.S. Pat. No. 4,522,958 (Das et al.), which descriptions are incorporated herein by reference, as well as those given by R. K. Iler in *The Chemistry of Silica*, John Wiley & Sons, New York (1979).

Due to their surface chemistry and commercial availability, silica hydrosols are preferred for use in the process of the invention. Such hydrosols are available in a variety of particle sizes and concentrations from, for example, Nyacol Products, Inc. in Ashland, Md.; Nalco Chemical Company in Oakbrook, Ill.; and E. I. Dupont de Nemours and Company in Wilmington, Del. Concentrations from about 10 to about 50 percent by weight of silica in water are generally useful, with concentrations of from about 30 to about 50 weight percent being preferred (as there is less water to be removed). If desired, silica hydrosols can be prepared, for example, by partially neutralizing an aqueous solution of an alkali metal silicate with acid to a pH of about 8 or 9 (such that the resulting sodium content of the solution is less than about 1 percent by weight based on sodium oxide). Other methods of preparing silica hydrosols, for example, electrodialysis, ion exchange of sodium silicate, hydrolysis of silicon compounds, and dissolution of elemental silicon are described by Iler, supra.

Preparation of a reactive resin sol preferably involves modification of at least a portion of the surface of the inorganic particles so as to aid in the dispersibility of the particles in the reactive species. This surface modification can be effected by various different methods which are known in the art. (See, for example, the surface modification techniques described in U.S. Pat. No. 2,801,185 (Iler) and U.S. Pat. No. 4,522,958 (Das et al.), which descriptions are incorporated herein by reference). Such methods include, for example, silanization, plasma treatment, Corona treatment, organic acid treatment, hydrolysis, titanation, and the like.

For example, silica particles can be treated with monohydric alcohols, polyols, or mixtures thereof (preferably, a saturated primary alcohol) under conditions such that silanol groups on the surface of the particles chemically bond with hydroxyl groups to produce surface-bonded ester groups. The surface of silica (or other metal oxide) particles can also be treated with organosilanes, for example, alkyl chlorosilanes, trialkoxy arylsilanes, or trialkoxy alkylsilanes, or with other chemical compounds, for example, organotitanates, which are capable of attaching to the surface of the particles by a chemical bond (covalent or ionic) or by a strong physical bond, and which are chemically compatible with the chosen resin(s). Treatment with organosilanes is generally preferred. When aromatic ring-containing epoxy resins are utilized, surface treatment agents which also contain at least one aromatic ring are generally compatible with the resin and are thus preferred. Similarly other metal oxides can be treated with organic acids (for example, oleic acid), or the organic acid can be incorporated into the photoreactive composition as a dispersant.

In preparing reactive resin sols, a hydrosol (for example, a silica hydrosol) can generally be combined with a water-miscible organic liquid (for example, an alcohol, ether, amide, ketone, or nitrile) and, optionally (if alcohol is used as the organic liquid), a surface treatment agent such as an organosilane or organotitanate. Alcohol and/or the surface treatment agent can generally be used in an amount such that at least a portion of the surface of the particles is modified sufficiently to enable the formation of a stable reactive resin sol (upon combination with the reactive species). Preferably, the amount of alcohol and/or treatment agent is selected so as to provide particles which are at least about 50 weight percent metal oxide (for example, silica), more preferably, at least about 75 weight percent metal oxide. (Alcohol can be added in an amount sufficient for the alcohol to serve as both diluent and treatment agent.) The resulting mixture can then be heated to remove water by distillation or by azeotropic distillation and can then be maintained at a temperature of, for example, about 100° C. for a period of, for example, about 24 hours to enable the reaction (or other interaction) of the alcohol and/or other surface treatment agent with chemical groups on the surface of the particles. This provides an organosol comprising particles which have surface-attached or surface-bonded organic groups.

The resulting organosol can then be combined with the reactive species and the organic liquid removed by, for example, using a rotary evaporator. Preferably, the organic liquid is removed by heating under vacuum to a temperature sufficient to remove even tightly-bound volatile components. Stripping times and temperatures can generally be selected so as to maximize removal of volatiles while minimizing advancement of the reactive species. Alternatively, methods known in the art such as ball milling, 3-roll milling, Brabender mixing, extruding or any other high shear mixing process can be used to mix the precondensed inorganic particles with the reactive species.

Preparation of Photoreactive Composition

The components of the photoreactive composition can be prepared by the methods described above or by other methods known in the art, and many are commercially available. These components can be combined under "safe light" conditions using any order and manner of combination (optionally, with stirring or agitation), although it is sometimes preferable (from a shelf life and thermal stability standpoint) to add the electron acceptor last (and after any heating step that is optionally used to facilitate dissolution of other components). Solvent can be used, if desired, provided that the solvent is chosen so as to not react appreciably with the components of the composition. Suitable solvents include, for example, acetone, dichloroethane, and acetonitrile. The reactive species itself can also sometimes serve as a solvent for the other components.

The components of the photoinitiator system are present in photochemically effective amounts (that is, amounts sufficient to enable the reactive species to undergo at least partial reaction under the selected exposure conditions, as evidenced, for example, by a change in density, viscosity, color, pH, refractive index, or other physical or chemical property). Generally, the photoreactive composition contains from about 5% to about 99.79% by weight of one or more reactive species (or a combination of reactive and non-reactive species); from about 0.01% to about 10% by weight of one or more photosensitizers (preferably, from about 0.1% to about 5%; more preferably, from about 0.2% to about 2%); up to about 10% by weight of one or more electron donor compounds (preferably, from about 0.1% to about 10%; more preferably, from about 0.1% to about 5%); and from about 0.1% to about 10% by weight of one or more electron acceptors (preferably, from about 0.1% to about 5%) based upon the total weight of solids in the composition (that is, the total weight of components other than solvent). The photoreactive composition can generally be loaded with about 0.01% to about 75% by volume of inorganic particles, based upon the total volume of the composition.

A wide variety of additives can be included in the photoreactive composition, depending upon the desired properties. Suitable additives include solvents, diluents, resins, binders, plasticizers, pigments, dyes, thixotropic agents, indicators, inhibitors, stabilizers, ultraviolet absorbers, and the like. The amounts and types of such additives and their manner of addition to the composition will be familiar to those skilled in the art.

As explained above, it is within the scope of this invention to include nonreactive polymeric binders in the photoreactive composition in order, for example, to control viscosity or increase photospeed. Such polymeric binders can generally be chosen to be compatible with the reactive species.

The photoreactive composition can be applied to a substrate by any of a variety of application methods. The composition can be applied by coating methods such as knife or bar coating, or by application methods such as dipping, immersion, spraying, brushing, spin coating, curtain coating, and the like. Alternatively, the composition can be applied drop-wise. The substrate can be made of any dimensionally stable material (for example, a material such as glass, fused silica, silicon, or calcium fluoride that has a softening or decomposition temperature higher than the temperatures of the process steps) and can be chosen from a wide variety of films, sheets, wafers, and other surfaces, depending upon the particular application. Preferably, the substrate is relatively flat, and, preferably, it has a refractive index that is lower than that of the periodic dielectric structure resulting from the process. Preferably, the substrate bears an antireflective coating that is matched to the exposure wavelength. The substrate can optionally be pre-treated with a primer (for example, silane coupling agents) to enhance adhesion of the photoreactive composition to the substrate.

The photoreactive composition can be thixotropic or show rheological behavior that is sensitive to both the particular surface treatment of the inorganic particles and their compatibility with other components. Thus, appropriate solvent content and shear conditions can be optimized for each particular composition and coating method to achieve uniform films of a desired thickness. Following coating, the photoreactive composition can, optionally, be soft baked (for example on a hot plate or in an oven) to remove some or all of any residual solvent. Preferably, the rheology of the resulting coated composition is such that it does not sag or flow significantly on the time scale of the exposure and development steps.

Exposure of Photoreactive Composition

At least a portion of the substantially inorganic photoreactive composition can be exposed, using multibeam interference (MBI) techniques involving at least three beams (preferably, at least four beams), to radiation of appropriate wavelength, spatial distribution, and intensity to produce a two-dimensional or three-dimensional (preferably, three-dimensional) periodic pattern of reacted and non-reacted portions of the photoreactive composition. Preferably, the periodic pattern is submicron-scale. The resulting non-reacted portion (or, alternatively, the reacted portion) of the composition can then be removed (for example, by solvent development) to form interstitial void space (which can be filled with other material, for example, air or a solvent having a different refractive index).

Such MBI techniques generally involve irradiating a sample (at least a portion) of the composition with electromagnetic radiation such that interference between radiation propagating in different directions within the sample gives rise to a two-dimensional or three-dimensional periodic variation of the intensity of irradiation within the sample, which produces a corresponding periodic pattern of reacted and non-reacted portions of the photoreactive composition.

Thus, a sample of photoreactive composition can be simultaneously exposed to electromagnetic radiation from a plurality of sources so as to produce an interference pattern within the sample, with the intensity of the irradiation or dose within the sample (which is determined by the interference pattern) varying periodically. Irradiation of the sample can induce photoreaction and, in some cases, an accompanying change in refractive index, thereby generating a corresponding pattern of variations in refractive index. If multiple exposures are to be utilized (for example, to write defects), then it can be preferable to select reactive species for which such changes are relatively minimal.

The sample of photoreactive composition can be irradiated with at least three coherent or partially-coherent sources of electromagnetic radiation. Preferably, the periodic pattern within the sample is formed by directing electromagnetic radiation from at least four coherent or partially-coherent sources at the sample so as to intersect and interfere within the sample. The sample can be subjected to multiple exposures, each producing respective interference patterns within the sample.

The scale of the periodicity within the sample is dependent upon the scale of the periodicity of the interference pattern, which in turn is dependent upon the frequency of the incident radiation, the refractive index of the composition, and the shape and direction of propagation of the interfering electromagnetic wavefronts within the sample. The differences between the individual wave vectors of each beam of radiation utilized determine the reciprocal lattice vectors and thus the symmetry of the resulting periodic dielectric structure. The specific lattice symmetry can be further tuned by independently varying the power and/or polarization state of each beam. Three-dimensional periodicity on a submicron scale can be produced in the sample without the need for expensive masks. This enables the production of periodic dielectric structures for use in optical and electro-optical applications in the infrared, visible, or shorter wavelength regions of the electromagnetic spectrum.

For example, a three-dimensional periodic dielectric structure can be produced in the following manner. A negative photoresist, whose solubility in an appropriate solvent is decreased after exposure to radiation with a wavelength of 355 nm, can be simultaneously irradiated by four laser beams at a wavelength of 355 nm from a frequency-tripled Nd:YAG laser, such that the beams intersect within a layer of the photoresist. The interference of the four beams can generate a three-dimensional periodic intensity modulation within the photoresist having fcc structural symmetry with a cubic unit cell size of approximately 0.6 µm. The photoresist can be developed to remove less-irradiated regions of the photoresist, thereby producing a three-dimensional periodic structure comprising interpenetrating networks of irradiated photoresist and air- or solvent-filled voids.

Although the intensity of radiation in any interference pattern generally changes slowly on the length scale of the wavelength, the resulting periodic dielectric structures can have relatively sharply-defined surfaces. This can be achieved as a result of non-linearity in photoreaction and subsequent development that can produce a threshold dividing soluble and insoluble portions of an irradiated sample. This threshold can correspond approximately to a contour of constant irradiation dose. Through appropriate selection of the threshold intensity, the fraction of the sample that is removed by development can be controlled. (For example, over-exposure can decrease the void space fraction in the resulting developed structure.) Non-linearity of photoreaction can be further enhanced by multi-photon exposure.

Preferably, the interference pattern generated during exposure is such that the portion of the sample to be removed during development forms a connected network. This ensures that such portion can be removed to produce voids. In addition, the interconnection of the voids enables a material having a refractive index (or other desirable property) different from that of the photoreactive composition to be introduced into the voids. It can also be important that removal does not destroy the periodic structure of the remaining portion. This can be achieved, for example, by ensuring that the interference pattern is such that the portion to be removed and the portion to be retained during development each form continuous interpenetrating networks.

A single exposure using simultaneously intersecting laser beams can be employed. Alternatively, a multiple exposure technique can be utilized.

For example, in a double exposure technique, the composition can be exposed twice, and each exposure can be such that the irradiation dose due to each exposure varies periodically. Radiation that is considered to form part of one exposure can be present at the same time as radiation considered to form part of the other. The characteristic of a double exposure, and the criterion used to assign radiation energy to one exposure or the other, is that the effect of interference between radiation from different exposures in determining the spatial variation of the total irradiation dose is reduced or eliminated with respect to the effect of interference between radiation from different sources belonging to the same exposure. This can be achieved either by ensuring that the degree of coherence between radiation from the two exposures is less than the degree of coherence between radiation from different sources belonging to the same exposure or by reducing the overlap in time between the two exposures. Thus, radiation in the two exposures can be derived from mutually incoherent sources, which can be, for example, the output of a single laser at different times, different lasers, or sources with different frequencies.

In an alternative method employing a double exposure technique, two pulses of electromagnetic radiation can be used in which interference between the two pulses is reduced or eliminated by ensuring that the second pulse arrives later than the first. For example, a single laser pulse can be split into two pulses, with the second delayed in time relative to the first. The first pulse can be split into four beams that can be used to create an initial three-dimensional interference pattern in the photoreactive composition. After the first pulse has decayed, during which time the second pulse has followed a delay line, the second pulse can be similarly split into four beams that follow different paths from the four beams in the first exposure and overlap to form a different three-dimensional interference pattern in the photoreactive composition.

Alternatively, the beams derived from the second pulse can follow substantially the same paths as the first four beams but can be subject to differing relative phase delays with respect to the relative phase delays of the beams from the first pulse, so that an interference pattern is formed that is similar or identical to the initial interference pattern but that is shifted in spatial position relative to the initial pattern. To generate the necessary relative phase delays, electro-optic phase modulators can be provided on at least one of the four beam lines and can be adjusted in the time interval between the first and second pulses. If a pulse from a frequency-tripled Nd:YAG laser of duration approximately 5 ns is used, then a delay line of a few meters length can give enough delay to avoid overlap in time between the two exposures and to allow the phase modulators to change state between pulses.

The double exposure technique can enable the shape of a contour of constant dose within the photoreactive composition to be accurately controlled, which can increase the ease of the design and fabrication of open, yet continuously-connected, structures. As mentioned earlier, however, the photoreactive composition can be irradiated with more than two exposures. As long as substantial photochemical changes do not occur in the total time during which irradiation takes place, it can be possible to ensure that all exposures produce periodic intensity patterns with the same periodicity or commensurable periodicities. In the case where successive exposures correspond to irradiation with laser beams following the same paths, the relative phase delay between the beams can be altered between each pulse from the source. This can enable three or more exposures of the composition to be performed, with each one producing an interference pattern spatially shifted with respect to the other interference patterns.

For some photoreactive compositions, it can be necessary to adjust the duration of the exposure of the composition to electromagnetic radiation to be short enough that the intensity interference pattern is not significantly perturbed by photo-induced changes in the refractive index of the composition. Short pulse exposure reduces the constraints on the mechanical stability of the optical components. To ensure that the intensity interference pattern formed in the composition is not significantly affected by changes in refractive index induced by irradiation, most preferably the composition is not subjected to irradiation for more than, for example, about 100 ms. With other photoreactive compositions, major photoinduced changes in refractive index do not occur during exposure but can occur during subsequent procedures (for example, during heating of the composition).

Useful MBI techniques also include, for example, those described by Kondo et al. in Applied Physics Letters 79, 725 (2001); by A. J. Turberfield in MRS Bulletin, p. 632, August 2001; by S. Yang et al. in Chemistry of Materials 14, 2831 (2002); by Kondo et al. in Applied Physics Letters 82, 2759 (2003); by I. Divliansky et al. in Applied Physics Letters 82, 1667 (2003); and by Yu. V. Miklyaev et al. in Applied Physics Letters 82 1284 (2003). Such references describe, for example, the use of diffractive masks, the use of tuned inhibitor concentrations to enhance contrast, the use of visible light for better penetration into the thickness of a resist, the use of multi-photon absorption to enhance contrast when writing a periodic structure, and the use of a "prism" on a photoresist to aid in achieving desired lightwave vectors in the photoresist. The stability of interference patterns can be further improved by using the phase locking techniques described in U.S. Pat. No. 5,142,385 (Anderson et al.).

If a defect-containing periodic dielectric structure is desired, at least a portion of the non-reacted portion of the photoreactive composition can be exposed to radiation of appropriate wavelength and intensity to cause multi-photon absorption and photoreaction to form additional reacted portion. Alternatively, defect writing can be carried out prior to MBI, if desired (as the order of the steps of the process can be varied). Multi-photon processes are particularly well-suited for the writing of structural defects, as such processes can have resolution below 150 nanometers and penetration depths that enable the creation of defects in the interior of a structure.

Exposure System and Its Use

Suitable light sources for multi-beam interference include both pulsed and continuous wave sources. Suitable continuous wave sources include argon ion lasers (for example, Innova 90 available from Coherent, Santa Clara, Calif.) and helium cadmium lasers (for example, those available from Melles Griot, Calif.). It can be desirable that the light source have a relatively long coherence length, relatively good beam quality, and relatively high power, so as to minimize the exposure time required. Suitable pulsed sources include the frequency doubled or tripled output of a nanosecond Nd:YAG laser (for example, a Pro-Series 250 available from Spectra-Physics, California) and the frequency doubled output of a femtosecond titanium sapphire laser (for example, a Spectra-Physics Mai Tai). Pulsed sources can be preferred to keep the exposure time short and reduce variability in the patterning, which can arise from vibrations of optical components.

Useful exposure systems for multi-photon writing of defects include at least one light source and at least one optical element. Any light source that provides sufficient intensity (to effect multi-photon absorption) at a wavelength appropriate for the selected photoinitiator system can be utilized. Such wavelengths can generally be in the range of about 500 to about 1700 nm; preferably, from about 600 to about 1100 nm; more preferably, from about 750 to about 1000 nm. Illumination can be continuous or pulsed or a combination thereof.

Suitable light sources for multi-photon defect writing include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts. Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Peak intensities generally are at least about $10^6$ W/cm². The upper limit of the pulse fluence is generally dictated by the ablation threshold of the photoreactive composition.

Preferred light sources for multi-photon defect writing include near-infrared pulsed lasers having a pulse length less than about $10^{-8}$ second (more preferably, less than about $10^{-9}$ second; most preferably, less than about $10^{-11}$ second). Other pulse lengths can be used provided that the above-detailed peak intensity and pulse fluence criteria are met.

Optical elements useful in carrying out the process of the invention include refractive optical elements (for example, lenses and prisms), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, waveplates, and birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20X Fluar).

Generally, exposure of the photoreactive composition can be carried out using a light source (as described above) along with an optical system as a means for controlling the three-dimensional spatial distribution of light intensity within the composition. For example, the light from a continuous wave or pulsed laser can be passed through a focusing lens in a manner such that the focal point is within the volume of the composition. The focal point can be scanned or translated in a three-dimensional pattern that corresponds to a desired shape, thereby creating a three-dimensional image of the desired shape. The exposed or illuminated volume of the composition can be scanned either by moving the composition itself or by moving the light source (for example, moving a laser beam using galvo-mirrors). The resulting exposed composition can be subjected to a post-exposure heat treatment, if desired.

Exposure times generally depend upon the type of exposure system used (and its accompanying variables such as numerical aperture, geometry of light intensity spatial distribution, the peak light intensity during, for example, the laser pulse (higher intensity and shorter pulse duration roughly correspond to peak light intensity)), as well as upon the nature of the composition exposed (and its concentrations of photosensitizer(s), photoinitiator, and electron donor compound).

Generally, higher peak light intensity in the regions of focus allows shorter exposure times, everything else being equal. Linear imaging or "writing" speeds generally can be about 5 to 100,000 microns/second using a continuous wave laser or using a pulsed laser with a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

When photoreactive compositions comprising cationically-curable reactive species are utilized, acid is generated in the exposed portion of the composition, and an optional post-exposure bake (for example, on a hot plate or in an oven) can be used to complete cure. Preferably, the gel point of the exposed portion of the composition can be reached at a low extent of cure, so as to quickly create a large differential solubility between exposed and non-exposed portions of the composition.

Replacement

After selective exposure of the photoreactive composition, either the reacted portion (for example, when using non-curable reactive species) or the non-reacted portion (preferably, the non-reacted portion) of the photoreactive composition can be removed to create void volume that, optionally, can be at least partially filled with one or more materials having a refractive index that is different from that of the remaining portion of the photoreactive composition. When exposure of a portion of the photoreactive composition produces a change in its solubility (for example, upon the curing of a low molecular weight reactive species into a higher molecular weight species), the non-exposed, non-reacted portion of the composition can be removed by development with an appropriate solvent (for example, propylene glycol methyl ether acetate (PGMEA), methyl isobutyl ketone, or cyclohexanone, or the like). Preferably, the development solvent can effectively solvate both the non-reacted reactive species and the inorganic particles, so that both can be essentially cleanly removed from the periodic dielectric structure.

For standard resist systems such as chemically amplified photoresists, the differential solubility (between the exposed and non-exposed portions of the photoreactive composition) can often be based upon the deprotection of hydrophilic groups on a polymer backbone. Such resists can typically be developed with basic solutions to remove the exposed portion (deprotected portion). (See, for example, *Introduction to Microlithography*, Second Edition, edited by Larry F. Thompson, C. Grant Wilson, and Murrae J. Bowden, American Chemical Society, Washington, D.C. (1994).)

Development can preferably be carried out in a manner that minimizes or prevents collapse of the photodefined pattern, which can result from stresses induced by surface tension of the solvents during drying. In order to minimize drying stress, the solvent used to develop the structure can alternatively be removed by $CO_2$ supercritical extraction (see, for example, C. J. Brinker and G. W. Scherer, *Sol-Gel Science*, Academic Press, New York, pp. 501-505 (1990)). In this method, the solvent-laden structure can be placed into an extraction chamber, and liquid $CO_2$ at a temperature below the critical point can be allowed to completely cover the structure. Generally, if there is a large excess of liquid $CO_2$ compared with the amount of solvent, the $CO_2$ nearly quantitatively exchanges with the solvent inside the structure. The structure can then be heated to above the critical point of $CO_2$ (31.1° C. and P=7.36 MPa), and the $CO_2$ can be rapidly vented to leave a periodic dielectric structure that is substantially free of solvent. After development, an optional pyrolysis step can be performed to remove remaining organic materials. Additional thermal annealing or sintering can also be carried out to further stabilize the inorganic structure. For example, the structure can be heated at a rate of about one degree per minute to about 600° C., held at that temperature for about one hour, and then slowly cooled.

After removal of either the reacted or the non-reacted portion of the photoreactive composition, the resulting void space of the periodic dielectric structure can, if desired, be partially or fully filled with one or more materials. Useful materials include those that are generally substantially non-absorbing in the wavelength range of a desired photonic bandgap. Suitable materials include, for example, semiconductors (organic or inorganic), metals (for example, tungsten and noble metals such as silver), or other materials exhibiting a desired property. Preferably, the material is a high refractive index material (for example, having a refractive index greater than about two) such as an inorganic semiconductor. Examples of useful inorganic semiconductors include silicon, germanium, selenium, gallium arsenide, indium phosphide, ternary compounds such as gallium indium phosphide and gallium indium arsenide, and the like. Doped semiconductors can also be used (for example, silicon can be doped with boron to create an n-type semiconductor).

Filling can be accomplished using common deposition methods including, for example, chemical vapor deposition (CVD), melt infiltration, deposition and sintering of semiconductor nanoparticles, chemical electrodeposition, oxide formation and reduction, and the like. (See, for example, the methods described in EP 1 052 312 (Lucent Technologies Inc.) and by D. J. Norris and Y. A. Vlasov in Adv. Mater. 13(6), 371 (2001).) CVD is often preferred. The conditions (for example, gas flow, pressure, and temperature) of the chosen deposition apparatus can preferably be adjusted to optimally infiltrate the periodic dielectric structure with material. By varying these conditions, the amount of material that is deposited inside the structure can be controlled. In the case of high refractive index materials, the amount of material inside the periodic dielectric structure can be an important parameter for obtaining a complete photonic bandgap. (See, for example, Busch et al., "Photonic Band Gap Formation in Certain Self-Organizing Systems", Physical Review E 58, 3896 (1998).)

After deposition, the material can be optionally further processed by thermal annealing, as known in the art. For example, low pressure chemical vapor deposition (LPCVD) can first be used to partially or completely fill the periodic dielectric structure with amorphous silicon. Then the amorphous silicon can be thermally annealed to form poly-crystalline silicon (poly-Si). A key advantage of this latter step is that amorphous silicon is deposited with very little surface roughness, thereby facilitating uniform filling. If desired, the amorphous silicon can be converted to poly-Si to inherit many of its desirable properties, such as its robust mechanical properties and increased refractive index.

If desired (for example, when the ratio of the refractive index of the material to that of the remaining portion of the photoreactive composition is less than about 2), the remaining portion of the photoreactive composition can be removed to produce an inverted periodic dielectric structure. Such removal can be accomplished by, for example, chemical etching using, for example, aqueous or ethanolic hydrofluoric acid (HF), a buffered oxide etchant, or other suitable etchants.

After the removal and optional filling steps, the resulting structure is a periodic dielectric structure optionally comprising a controlled or engineered defect. The structure can have sufficient periodicity of refractive index in at least two dimensions (preferably, three dimensions) to enable it to exhibit at least a partial photonic bandgap (preferably, a complete photonic bandgap). Preferably, the periodicity is micron-scale periodicity (more preferably, submicron-scale) so that the partial photonic bandgap is exhibited at wavelengths ranging from ultraviolet (UV) to infrared (IR) (more preferably, at visible to near-IR wavelengths).

Periodic dielectric structures exhibiting a complete photonic bandgap include those based on interpenetrating diamond-type lattices of a dielectric material and air. The particular lattice structure determines the ratio of refractive indices (of dielectric material and air) necessary to achieve a partial or complete photonic bandgap. Such structures are described, for example, by Ho et al. in Phys. Rev. Lett. 65(25), 3152 (1990); by Yablonovitch et al. in Physica B, 175(1-3), 81 (1991); in U.S. Pat. App. Pub. No. 2002/0059897 A1 (John et al.); in U.S. Pat. No. 5,739,796 (Jasper et al.); in U.S. Pat. No. 5,406,573 (Ozbay et al.); in U.S. Pat. No. 5,335,240 (Ho et al.); in U.S. Pat. No. 5,600,483 (Fan et al.); in U.S. Pat. No. 5,440,421 (Fan et al.); and by S. G. Johnson et al. in Appl. Phys. Lett. 77, 3490 (2000).

The resulting periodic dielectric structure can be further modified, structured, altered, processed, or patterned by additional processes known in the art (mechanical, chemical, electrical, or optical) to produce an optical device (for example, an optical waveguide). Such devices include those that are capable of guiding, attenuating, filtering, and/or modulating electromagnetic radiation. Additional processes can be used, for example, to add new layers of material to (or remove material from) a substrate (if used), to add new material to (or remove material from) the periodic dielectric structure, or to pattern a substrate. When it is desirable to add new material to the periodic dielectric structure, the structure can be refilled, partially or completely, with another material.

Controlled defect-containing, three-dimensional (3-D) periodic dielectric structures exhibiting a complete photonic bandgap can be used as the basis for optical integrated circuits. In one possible device, optical waveguides can essentially perfectly confine light and efficiently guide it around sharp corners essentially without radiation loss. For example, in a 3-D stack of logs-type periodic dielectric structure (see, for example, U.S. Pat. No. 5,335,240 (Ho et al.)), replacing one log with an air defect in one layer can allow the structure to be used as a straight single mode waveguide. Light having a frequency within the photonic bandgap of the structure can be introduced into the waveguide (for example, by butt coupling an optical fiber to the edge of the structure and aligning the core of the fiber parallel with the air defect). As a result of the high degree of confinement, light introduced into the waveguide can propagate with minimal losses. Optical waveguides can also be made in two dimensions, provided that the average refractive index of the two-dimensional periodic dielectric structure is sufficiently high to confine light via total internal reflection.

As described by A. Chutinan and S. Noda, in Appl. Phys. Lett. 75 (24), 3739 (2002), light can be transmitted around a 90-degree bend. For example, in the stack of logs-type periodic dielectric structure, a waveguide with a 90-degree bend can be made by removing two logs, one perpendicular to the other. Optimal transmission efficiency around the bend can be achieved when the second log is in the layer directly above the first log. Splitters and couplers are other useful optical devices that can be made using the same principles. The optimum size and shape of the controlled defect for maximum light confinement to the defect can be dependent on the particular periodic dielectric structure utilized. The 90-degree turn is one of the most important types of defects, allowing miniaturization of optical circuits.

Single point defects in the periodic dielectric structure can be used as high quality factor microcavities. For example, a single lattice point can be enlarged slightly, reduced in size, or removed altogether, to tune the wavelength of the light that will be confined in the defect. Due to the extremely high effective reflectivity of the microcavity, the rate of spontaneous emission can be modified. If an emitter is introduced into the point defect, ultralow threshold lasing can be achieved.

Combinations of single point defects and line defects can be used to make more complicated devices such as filters, wavelength division multiplexers and de-multiplexers, signal modulators, and so forth. Such integrated optical circuits (or systems) have maximum utility when multiple components are incorporated into a single periodic dielectric structure. This can be achieved using the process of the invention.

When the remaining portion of the photoreactive composition is not removed, it is possible to produce devices such as amplifiers and high efficiency, low threshold lasers. The inorganic portion of the remaining photoreactive composition can be excited (with radiation at wavelengths at which any material added by filling is transparent) to emit radiation at wavelengths that are in the bandgap of the periodic dielectric structure. For example, a composition that contains erbium ions can be excited with 980 nm radiation to emit 1550 nm radiation as an ultralow threshold laser. Alternatively, semiconductor nanoparticle quantum dots can be incorporated into the photoreactive composition as emitters.

Preferred Embodiment of the Process

Referring to FIGS. 1a-1h, in a preferred embodiment of the process of the invention a substantially inorganic photoreactive composition 10 (optionally applied to a substrate 20) can be provided (FIG. 1a), and at least a portion of the composition 10 can be exposed using a multibeam interference apparatus 30 (FIG. 1b) so as to form a two-dimensional or three-dimensional periodic pattern of exposed and non-exposed portions 32 and 36, respectively (FIG. 1c), of the composition 10 (and to effect photoreaction in the exposed portion). The nature and scale of the periodic pattern can be adjusted by varying the wavelength, interference angle, power, and/or polarization of each of the laser beams.

Figure 1D:
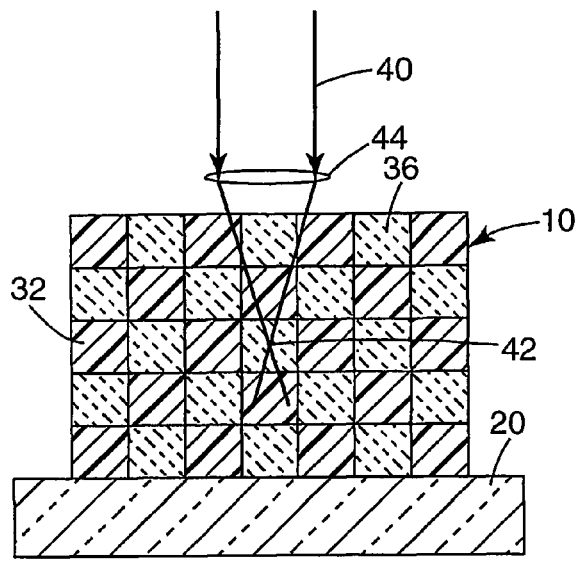
Figure 1E:
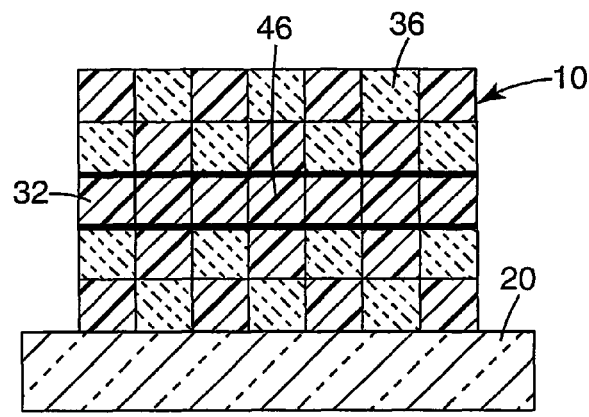
Figure 1F:
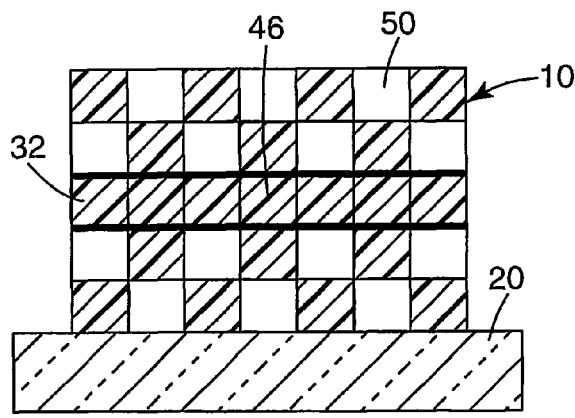
Figure 1G:
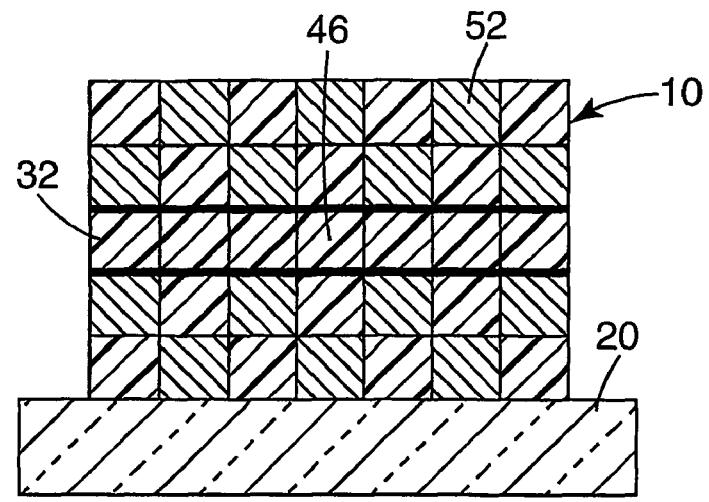

A laser beam 40 can be focused to a pinpoint 42 inside the resulting patterned structure using a lens 44 (FIG. 1d). The position of the pinpoint can be moved in a desired pattern to form additional exposed portion 46 (FIG. 1e). The position of the pinpoint can be adjusted by moving the laser beam, the lens, or the patterned structure (with respect to the focused laser beam) using, for example, a 3-axis stage.

The non-exposed portion 36, for example, of the photoreactive composition 10 can be removed by development with an appropriate solvent. This removal creates void space 50 (FIG. 1f) that can be filled (FIG. 1g) with a relatively high refractive index material 52 (for example, a semiconductor) using any of a variety of techniques (for example, chemical vapor deposition). Due to its substantially inorganic nature, at least a portion of the patterned photoreactive composition remains intact through any process steps that are carried out at elevated temperature.

Figure 1H:
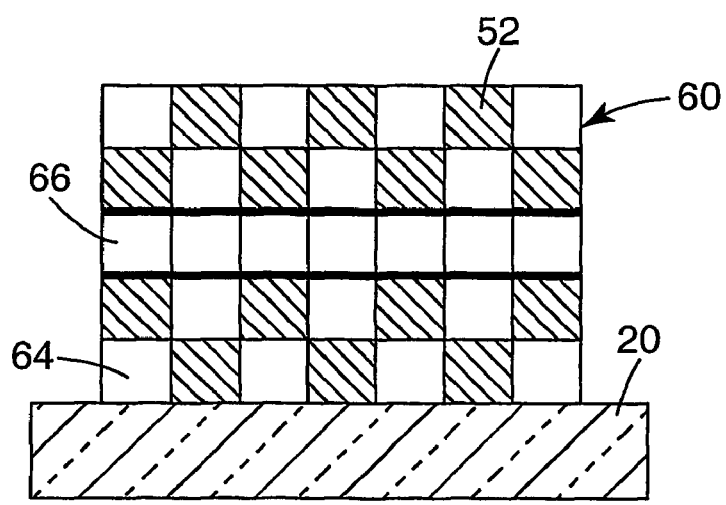

The resulting filled structure can, optionally, be exposed to an etchant (for example, HF) that is capable of selectively removing the remaining photoreactive composition (for example, the exposed portion thereof) while leaving the high refractive index material essentially intact. The resulting completed structure 60 comprises the high refractive index material with 3-dimensionally periodic air-filled voids 64 and a non-periodic, engineered air defect 66 (FIG. 1h).

EXAMPLES

Objects and advantages of this invention are further illustrated by the following examples, but the particular materials and amounts thereof recited in these examples, as well as other conditions and details, should not be construed to unduly limit this invention.

Example 1(a)

Providing a Substantially Inorganic Photoreactive Composition

Preparation of Rhodamine B Hexafluoroantimonate

A solution of 4.2 g of the chloride salt of Rhodamine B dye (Aldrich Chemical Co., Milwaukee, Wis.) in 220 mL deionized water was filtered through diatomaceous earth. The filtrate was removed, and 10.0 g $NaSbF_6$ (Advanced Research Chemicals, Inc., Catoosa, Okla.) was added with stirring. After mixing for 5 minutes, the resulting mixture was filtered, and the resulting solid was washed with deionized water and dried in an oven at 50-80° C. overnight. A dark red solid was obtained (4.22 g), which was analyzed by infrared (IR) spectroscopy, nuclear magnetic resonance (NMR) spectroscopy, and elemental analysis for chloride. The analysis was consistent with the hexafluoroantimonate salt of Rhodamine B (structure shown below).

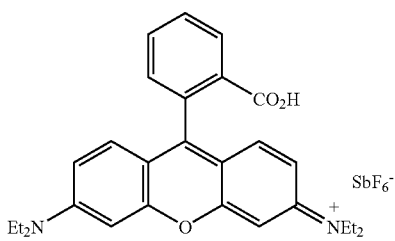

Preparation of Surface-Treated, Precondensed Inorganic Nanoparticles 900 g of NALCO 2327 (dispersion of approximately 20 nm average diameter silica particles in water, available from ONDEO Nalco, Bedford Park, Ill.) were placed in a 2 liter beaker and, under medium agitation, prewashed AMBERLITE IR-120 plus ion exchange resin (available from Aldrich Chemical Co., Milwaukee, Wis.) was slowly added until the pH measured between 2-3 (using COLORPHAST pH paper, pH range 1-14, available from EM Science, Gibbstown, N.J.). After stirring for 30 minutes at room temperature, the resulting mixture was filtered through 10-micron nylon mesh fabric to remove the ion exchange resin, and the solids were determined to be 41.6 percent. 800 g of the ion-exchanged NALCO 2327 dispersion were placed in a round bottom flask and, under medium agitation, 230 g of deionized water (to prevent agglomeration as the pH is raised) was added, followed by a dropwise addition of aqueous ammonium hydroxide to bring the pH to between 8-9. To this mixture, was added a premixed solution of 1600 g of 1-methoxy-2-propanol and 40.92 g of trimethoxyphenylsilane (0.62 mmol of silane per g of silica) over five to ten minutes. The resulting non-agglomerated silica dispersion was heated at 90-95° C. for approximately 22 hours. Silica solids of the dispersion were determined to be 15.4 percent by gravimetric analysis.

Addition of Cationically Reactive Species

To a mixture of 31.5 g of ERL™ 4221E (cycloaliphatic epoxy available from Dow Chemical, Midland, Mich.) and 3.5 g of 1,5-pentanediol (Aldrich Chemical Co.) is added 390 g of the 15.4 percent silica dispersion. The components are mixed well, and the water and methoxy propanol are vacuum stripped, while slowly heating using a rotary evaporator with aspirator and oil bath. Final stripping temperature (using a vacuum pump) is 130° C. for 45 minutes. 96 g of the resulting mixture is placed in a 100-g rated speed mix cup (available from FlackTek Inc., Landrum, S.C.) along with 5.0 g of 3-glycidyloxypropyltrimethoxysilane (Aldrich Chemical Co.), and the resulting combination is mixed for ten minutes at 3000 rpm using a FlackTek Inc. DAC 150 FVZ speed mixer (FlackTek Inc.). The resulting silica-epoxy sol contains 60 percent, by weight surface-treated nanosilica.

Addition of Multi-Photon Photoinitiator System

Working under safe light conditions to prevent premature curing of the reactive species, 2.06 g of the silica-epoxy sol prepared above is combined with a solution of 0.020 g diaryliodonium hexafluoroantimonate (available from Sartomer, West Chester, Pa.), 0.010 g of Rhodamine B hexafluoroantimonate (that is, N-[9-(2-carboxyphenyl)-6-(diethylamino)-3H-xanthen-3-ylidene]-N-ethylethanaminium hexafluoroantimonate, prepared essentially as described above), 0.2 g tetrahydrofuran, and 0.65 g 1,2-dicholorethane. The resulting mixture is stirred for 15 minutes using a magnetic stirrer to provide a homogeneous dispersion.

Example 1(b)

Multibeam Interference (MBI) Exposure of Photoreactive Composition

A base, such as triethylamine, is added to the resulting substantially inorganic composition of Example 1(a), and the resulting composition is applied to a suitable substrate (for example, silicon or glass) by coating (for example, by dip coating, spin coating, gravure coating, or Meyer rod coating), with the viscosity of the composition being carefully controlled. (The base helps mitigate nonzero-background light intensity in "unexposed" portions of the composition by partially neutralizing local photoacids generated during exposure and thereby diminishes homogeneous cross-linked background.) Prior to exposure, a heating step (for example, a soft bake on a hot plate) is applied to remove residual solvent from the composition.

The resulting coated substrate is placed into a region in which beams of light from a continuous wave (cw) laser are allowed to interfere. The coated substrate or sample is placed on an x-y linear air bearing stage fitted with a vacuum chuck to securely hold the sample in place. The sample is exposed to the interference pattern created using three or four non-coplanar beams of an argon ion laser (available, for example, from Coherent, Santa Clara, Calif.) operating at 488 nm for a time on the order of one second. A shutter (mechanical or acousto-optic) is used to precisely control the exposure time. The beam diameter from the laser is on the order of several millimeters. The interference angle, power, and polarization of each of the laser beams is chosen so that at least one of the Bravais lattice vectors of the interference pattern is parallel to the x-y plane of stage travel.

Example 1(c)

Multi-Photon Exposure of Photoreactive Composition

Following MBI exposure, the linear air bearing stage is moved along its travel so that the exposed area of the sample is now beneath the output of a second optical train. Multi-photon reaction of a defect structure is performed using a diode pumped Ti:sapphire laser (available from Spectra-Physics, Mountain View, Calif.) operating at a wavelength of 800 nm, pulse width approximately 100 fs, pulse repetition rate of 80 MHz, beam diameter of approximately 2 mm. The optical train consists of low dispersion turning mirrors, a beam expander, an optical attenuator to vary the optical power, acousto-optic modulator for shuttering, and a 100× oil immersion microscope objective (NA 1.4) mounted on a linear z-stage to focus light into the sample. The height of the microscope objective (z-axis position) above the sample is adjusted until the focal position is inside the coating. Fine adjustment of the focal position is performed by monitoring multi-photon fluorescence intensity using confocal optics and a photomultiplier tube detector. Since some photobleaching of the multi-photon photosensitizer occurs upon exposure, a pattern of bright and dark areas can be identified and the focal position placed in a desired focal plane. A defect structure is created in the coating by scanning the stage at constant speed along a desired path. To minimize optical loss in the final device, this path is aligned with one or more lattice vectors for the interference pattern.

Example 1(d)

Removal of Non-Reacted Portion of the Photoreactive Composition

After exposure, the sample is heated to accelerate the cure of the composition in the exposed regions. The unexposed portion is then removed with a suitable solvent (for example, propylene glycol methyl ether acetate) to form interstitial void space. The solvent is removed with supercritical drying to minimize drying stress. The resulting exposed, developed sample is pyrolyzed (for example, by heating in a Vulcan oven, Model #3-350, Degussa-Ney, Bloomfield, Conn., at 5° C./min to 600° C. for one hour) to remove organic content and then further heat treated to minimize porosity of the remaining silica. The resulting periodic dielectric structure exhibits at least a partial photonic bandgap.

Example 1(e)

Filling of Interstitial Void Space

Amorphous silicon is deposited into the interstitial void space of the periodic dielectric structure using a commercially available low pressure chemical vapor deposition furnace (available from ASM, Phoenix, Ariz.) operating at approximately 560° C. Deposition conditions are chosen such that homogeneous infiltration of amorphous silicon through the full thickness of the structure is achieved. Following deposition, the amorphous silicon is converted to polycrystalline silicon by annealing at 600° C. for eight hours. The resulting structure is cooled to room temperature. The remaining silica is removed by wet etching with a dilute HF solution (5-10 weight percent HF in water). A silicon/air periodic dielectric structure is obtained. The periodic dielectric structure is examined using a scanning electron microscope (SEM). Air channels are observed that correspond to the original positions of polymerized substantially inorganic photoreactive composition.

The referenced descriptions contained in the patents, patent documents, and publications cited herein are incorporated by reference in their entirety as if each were individually incorporated. Various unforeseeable modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A process comprising
   (a) providing a substantially inorganic photoreactive composition comprising
      (1) at least one cationically reactive species,
      (2) a multi-photon photoinitiator system, and
      (3) a plurality of precondensed, inorganic nanoparticles;
   (b) exposing, using a multibeam interference technique involving at least three beams, at least a portion of said photoreactive composition to radiation of appropriate wavelength, spatial distribution, and intensity to produce a two-dimensional or three-dimensional periodic pattern of reacted and non-reacted portions of said photoreactive composition;
   (c) exposing at least a portion of said non-reacted portion of said photoreactive composition to radiation of appropriate wavelength and intensity to cause multi-photon absorption and photoreaction to form additional reacted portion and a remaining non-reacted portion;
   (d) removing said remaining non-reacted portion or the entire reacted portion of said photoreactive composition to form interstitial void space; and
   (e) at least partially filling said interstitial void space with at least one material having a refractive index that is different from the refractive index of the remaining non-reacted or reacted portion of said photoreactive composition.

2. The process of claim 1 wherein said periodic pattern is three-dimensional.

3. The process of claim 1 wherein said periodic pattern has submicron-scale periodicity.

4. The process of claim 1 wherein said process further comprises pyrolysis, and wherein said substantially inorganic photoreactive composition loses less than about 60 percent of its initial weight upon photoreaction and pyrolysis.

5. The process of claim 1 wherein said cationically reactive species is polymerizable or crosslinkable.

6. The process of claim 5 wherein said cationically curable species is organic or hybrid organic/inorganic.

7. The process of claim 1 wherein said substantially inorganic photoreactive composition comprises at least one material selected from the group consisting of condensates of photoreactive silanes, condensates of mixtures of reactive and non-reactive silanes, oligomeric siloxane materials, branched silicon-containing oligomeric and polymeric materials, and sol-gel materials.

8. The process of claim 1 wherein said multi-photon photoinitiator system comprises (a) at least one multi-photon photosensitizer; (b) at least one electron acceptor; and (c) optionally, at least one electron donor.

9. The process of claim 8 wherein said multi-photon photoinitiator system comprises at least one electron donor.

10. The process of claim 8 wherein said multi-photon photosensitizer has a two-photon absorption cross-section greater than that of fluorescein.

11. The process of claim 10 wherein said multi-photon photosensitizer has a two-photon absorption cross-section greater than about 1.5 times that of fluorescein.

12. The process of claim 8 wherein said multi-photon photosensitizer is selected from Rhodamine B, molecules in which two donors are connected to a conjugated π (pi)-electron bridge, molecules in which two donors are connected to a conjugated π (pi)-electron bridge which is substituted with one or more electron accepting groups, molecules in which two acceptors are connected to a conjugated π (pi)-electron bridge, and molecules in which two acceptors are connected to a conjugated π (pi)-electron bridge which is substituted with one or more electron donating groups.

13. The process of claim 12 wherein said multi-photon photosensitizer is Rhodamine B.

14. The process of claim 8 wherein said electron acceptor is selected from the group consisting of iodonium salts, diazonium salts, sulfonium salts, and mixtures thereof.

15. The process of claim 9 wherein said electron donor is selected from the group consisting of amines; amides; ethers; ureas; sulfinic acids and their salts; salts of ferrocyanide, ascorbic acid and its salts; dithiocarbamic acid and its salts; salts of xanthates; salts of ethylene diamine tetraacetic acid; $SnR_4$ compounds, wherein each R is independently selected from alkyl, aralkyl, aryl, and alkaryl groups; ferrocene; and mixtures thereof.

16. The process of claim 1 wherein said inorganic nanoparticles are selected from the group consisting of metal oxide nanoparticles, metal carbonate nanoparticles, metal fluoride nanoparticles, and combinations thereof.

17. The process of claim 16 wherein said inorganic nanoparticles are metal oxide nanoparticles.

18. The process of claim 17 wherein said metal oxide is selected from the group consisting of silica, titania, alumina, zirconia, vanadia, antimony oxide, tin oxide, and mixtures thereof.

19. The process of claim 18 wherein said metal oxide is silica.

20. The process of claim 1 wherein said inorganic nanoparticles are less than about 150 nanometers in average diameter.

21. The process of claim 1 wherein said inorganic nanoparticles have been surface treated.

22. The process of claim 1 wherein said exposing is carried out using a multibeam interference technique involving at least four beams.

23. The process of claim 1 wherein said exposing is by irradiating in pulsed mode.

24. The process of claim 1 wherein said radiation is near-infrared radiation.

25. The process of claim 1 wherein said remaining non-reacted portion of said photoreactive composition is removed to form said interstitial void space.

26. The process of claim 25 wherein said removing of said remaining non-reacted portion of said photoreactive composition is accomplished by development with a solvent.

27. The process of claim 1 wherein said filling involves deposition of said material by chemical vapor deposition.

28. The process of claim 25 wherein said process further comprises the step of removing said remaining reacted portion of said photoreactive composition.

29. The process of claim 28 wherein said removing is by chemical etching.

30. The process of claim 1 wherein said material has a refractive index greater than about 2.

31. The process of claim 1 wherein said material is an inorganic semiconductor.

32. The process of claim 31 wherein said inorganic semiconductor is selected from the group consisting of silicon, germanium, selenium, gallium arsenide, indium phosphide, gallium indium phosphide, and gallium indium arsenide.

33. The process of claim 32 wherein said inorganic semiconductor is silicon.

34. The process of claim 1 wherein said process further comprises sintering, pyrolysis, and/or annealing.

35. A process comprising
(a) providing a substantially inorganic photoreactive composition comprising
  (1) at least one cationically curable species,
  (2) a multi-photon photoinitiator system comprising
    (i) at least one multi-photon photosensitizer,
    (ii) at least one electron acceptor, and
    (iii) optionally, at least one electron donor, and (3) a plurality of precondensed, silica nanoparticles having an average particle diameter in the range of about 5 nanometers to about 20 nanometers;
(b) exposing, using a multibeam interference technique involving at least four beams, at least a portion of said photoreactive composition to radiation of appropriate wavelength, spatial distribution, and intensity to produce a three-dimensional, submicron-scale, periodic pattern of reacted and non-reacted portions of said photoreactive composition;
(c) exposing at least a portion of said non-reacted portion of said photoreactive composition to radiation of appropriate wavelength and intensity to cause multi-photon absorption and photoreaction to form additional reacted portion and a remaining non-reacted portion;
(d) removing said remaining non-reacted portion of said photoreactive composition to form interstitial void space;
(e) at least partially filling said interstitial void space with at least one material having a refractive index that is different from the refractive index of the remaining reacted portion of said photoreactive composition; and
(f) removing said remaining reacted portion of said photoreactive composition.

* * * * *

UNITED STATES PATENT AND TRADEMARK OFFICE
CERTIFICATE OF CORRECTION

PATENT NO. : 7,655,376 B2  Page 1 of 1
APPLICATION NO. : 10/596186
DATED : February 2, 2010
INVENTOR(S) : Anderson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 571 days.

Signed and Sealed this

Twenty-third Day of November, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,655,376 B2 | Page 1 of 4 |
| APPLICATION NO. | : 10/596186 | |
| DATED | : February 2, 2010 | |
| INVENTOR(S) | : Mark T Anderson | |

It is certified that error appears in the above-identified patent and that said Letters Patent is hereby corrected as shown below:

Title Page, Item (57) Column 2 (Abstracts)
Line 4; Delete "and 10" and insert -- and --, therefor.

Title Page 3, Item (56) Column 1 (Other Publications)
Line 1; Delete "Cystals" and insert -- Crystals --, therefor.
Line 32; Delete "Photfabrication" and insert -- Photofabrication --, therefor.

Title Page 3, Item (56) Column 2 (Other Publications)
Line 18; Delete "Meaurement" and insert -- Measurement --, therefor.
Line 32; Delete "Hologrphic" and insert -- Holographic --, therefor.

Column 1
Line 14; Before "exhibit" delete "is".

Column 5
Line 17 (Approx.); After "like." insert -- The molecular weight of the
epoxy-containing materials can vary from about 58 to about 500 or more.

Useful epoxy-containing materials include those which contain cyclohexene
oxide groups such as epoxycyclohexanecarboxylates, typified by
3,4-epoxycyclohexylmethyl-3,4-epoxycyclohexanecarboxylate,
3,4-epoxy-2-methylcyclohexylmethyl-3,4-epoxy-2-methylcyclohexane carboxylate, and
bis(3,4-epoxy-6-methylcyclohexylmethyl) adipate. A more detailed list of useful
epoxides of this nature is set forth in U.S. Patent No. 3,117,099.

Other epoxy-containing materials that are useful include glycidyl ether monomers of the
formula Signed and Sealed this
Twelfth Day of April, 2011

David J. Kappos
*Director of the United States Patent and Trademark Office*

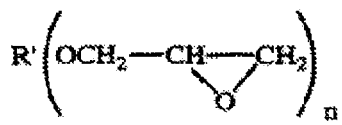

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Patent No. 3,018,262, and in Handbook of Epoxy Resins, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidyl methacrylate, diglycidyl ethers of Bisphenol A (for example, those available under the trade designations EPON 828 and EPON 825 from Resolution Performance Products, formerly Shell Chemical Co., as well as those available under the trade designation DER from Dow Chemical Co.), vinylcyclohexene dioxide (for example, the compounds available under the trade designations ERL 4206 from Union Carbide Corp.), 3,4-epoxycyclohexylmethyl-3,4epoxycyclohexene carboxylate (for example, the compounds available under the trade designations ERL 4221, Cyracure UVR 6110 or UVR 6105 from Union Carbide Corp.), 3,4-epoxy-6-methylcyclohexylmethyl-3,4-epoxy-6-methyl-cyclohexene carboxylate (for example, the compounds available under the trade designation ERL 4201 from Union --.

Column 6
Line 55; Delete "4" and insert -- 4- --, therefor.

Column 7
Line 12-65; Delete "The photoinitiator system can be a multi-photon photoinitiator system, as the use of such systems enables enhanced contrast as well as defect writing in 3-dimensional periodic dielectric structures. Such a system preferably is a two- or three-component system that comprises at least one multi-photon photosensitizer, at least one electron acceptor, and, optionally, at least one electron donor. Such multi-component The molecular weight of the epoxy-containing materials can vary from about 58 to about 500 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula

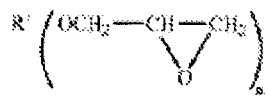

where R' is alkyl or aryl and n is an integer of 1 to 6. Examples are glycidyl ethers of polyhydric phenols obtained by reacting a polyhydric phenol with an excess of chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in Handbook of Epoxy Resins, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidyl methacrylate, diglycidyl ethers of Bisphenol A (for example, those available under the trade designations EPON 828 and EPON 825 from Resolution Performance Products, formerly Shell Chemical Co., as well as those available under the trade designation DER from Dow Chemical Co.), vinylcyclohexene dioxide (for example, the compounds available under the trade designations ERL 4206 from Union Carbide Corp.), 3,4-epoxycyclohexylmethyl-3,4-epoxycyclohexene carboxylate (for example, the compounds available under the trade designations ERL 4221, Cyracure UVR 6110 or UVR 6105 from Union Carbide Corp.), 3,4-epoxy-6-methylcyclohexylmethyl-3,4-epoxy-6-methyl-cyclohexene carboxylate (for example, the compounds available under the trade designation ERL 4201 from Union component systems can provide enhanced sensitivity, enabling photoreaction to be effected in a shorter period of time and thereby reducing the likelihood of problems due to movement of the sample and/or one or more components of the exposure system."
and
insert -- The photoinitiator system can be a multi-photon photoinitiator system, as the use of such systems enables enhanced contrast as well as defect writing in 3-dimensional periodic dielectric structures. Such a system preferably is a two- or three component system that comprises at least one multi-photon photosensitizer, at least one electron acceptor, and, optionally, at least one electron donor. Such multi-component systems can provide enhanced sensitivity, enabling photoreaction to be effected in a shorter period of time and thereby reducing the likelihood of problems due to movement of the sample and/or one or more components of the exposure system. --, therefor.

Column 8
Delete "moeties" and insert -- moieties --, therefor.

CERTIFICATE OF CORRECTION (continued)

U.S. Pat. No. 7,655,376 B2

Column 9
Line 3; Delete "aggregration" and insert -- aggregation --, therefor.

Column 10
Line 9; Delete "photosensitizer;" and insert -- photosensitizer, --, therefor.

Column 17-18
Line 1 (Below fourth Structure); Delete "R=R=C2H5, C10H21, C18H37" and insert
-- R=R=$C_2H_5$, $C_{10}H_{21}$, $C_{18}H_{37}$ --, therefor.

Column 19
Line 63; Delete "$SbF^{6-}$" and insert -- $SbF_6^-$ --, therefor.

Column 21
Line 33; Delete "F6As⁻" and insert -- $F_6As^-$ --, therefor.
Line 33; Delete "$X^{31}$" and insert -- $X^-$ --, therefor.
Line 46; Delete "tritolyesulfonium" and insert -- tritolylsulfonium --, therefor.

Column 24
Line 12; Delete "4.4'" and insert -- 4,4' --, therefor.

Column 31
Line 22; Delete "82" and insert -- 82, --, therefor.